United States Patent
Tanaka et al.

(10) Patent No.: US 8,686,398 B2
(45) Date of Patent: Apr. 1, 2014

(54) SEMICONDUCTOR LIGHT EMITTING DEVICE

(75) Inventors: Akira Tanaka, Kanagawa-ken (JP);
Yoko Motojima, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/599,852

(22) Filed: Aug. 30, 2012

(65) Prior Publication Data

US 2013/0228742 A1   Sep. 5, 2013

(30) Foreign Application Priority Data

Mar. 2, 2012 (JP) ................ P2012-046048
Mar. 7, 2012 (JP) ................ P2012-050027

(51) Int. Cl.
*H01L 29/06* (2006.01)

(52) U.S. Cl.
USPC ............ 257/13; 257/79; 257/627; 257/628

(58) Field of Classification Search
USPC ............ 257/13–25, 627, 628, 79–84
See application file for complete search history.

(56) References Cited

U.S. PATENT DOCUMENTS

| | | | |
|---|---|---|---|
| 7,812,338 B2 | 10/2010 | Ryu | |
| 7,968,864 B2 | 6/2011 | Akita et al. | |
| 8,022,388 B2 * | 9/2011 | Brandes | 257/13 |
| 8,106,412 B2 | 1/2012 | Takao et al. | |
| 2008/0182384 A1 | 7/2008 | Hata | |
| 2009/0008652 A1 * | 1/2009 | Ueda et al. | 257/79 |
| 2011/0089451 A1 | 4/2011 | Jeong et al. | |
| 2011/0089452 A1 | 4/2011 | Jeong et al. | |
| 2011/0182311 A1 | 7/2011 | Yoshizumi et al. | |

FOREIGN PATENT DOCUMENTS

| | | |
|---|---|---|
| JP | 2002-270894 | 9/2002 |
| JP | 2007-324459 | 12/2007 |
| JP | 2008-103711 | 5/2008 |
| JP | 2008-117824 | 5/2008 |
| JP | 2008-270261 | 11/2008 |
| JP | 2009-200337 | 9/2009 |
| JP | 2009-206461 | 9/2009 |
| JP | 2010-087270 | 4/2010 |
| JP | 2010-114418 | 5/2010 |
| JP | 2010-263251 | 11/2010 |
| JP | 2011-086909 | 4/2011 |
| JP | 2011-086910 | 4/2011 |

* cited by examiner

*Primary Examiner* — Anthony Ho
(74) *Attorney, Agent, or Firm* — Patterson & Sheridan, LLP

(57) ABSTRACT

A semiconductor light emitting device includes a first conductivity-type first semiconductor layer, a second conductivity-type second semiconductor layer, a semiconductor light emitting layer, and first and second electrodes. The semiconductor light emitting layer is provided between the first semiconductor layer and the second semiconductor layer, and includes a multiple quantum well structure. The quantum well structure includes well layers and barrier layers each laminated alternately, each of the well layers being not less than 6 nm and not more than 10 nm. The first and second electrodes are electrically connected to the first and second semiconductor layers such that current flows in a direction substantially vertical to the main surface.

4 Claims, 34 Drawing Sheets

C-Plane (0,0,0,1)  Polar face
A-Plane (1,1,-2,0) Non-polar face
Plane (1,1,-2,2) Semi-polar face

| Name | Numeral | In Composition x of In$_x$Ga$_{(1-x)}$N | | | |
|---|---|---|---|---|---|
| | | Embodiment | 1st Comparative Example | 2nd Comparative Example | 3rd Comparative Example |
| N-GaN clad layer | 112 | — | — | — | — |
| InGaN barrier layer | 125e | 0 | 0 | 0 | 0 |
| InGaN well layer | 126d | 0.15 | 0.15 | 0.15 | 0.15 |
| InGaN barrier layer | 125d | 0 | 0.03 | 0.05 | 0 |
| InGaN well layer | 126c | 0.15 | 0.15 | 0.15 | 0.15 |
| InGaN barrier layer | 125c | 0.03 | 0.03 | 0.03 | 0 |
| InGaN well layer | 126b | 0.15 | 0.15 | 0.15 | 0.15 |
| InGaN barrier layer | 125b | 0.05 | 0.03 | 0 | 0 |
| InGaN well layer | 126a | 0.15 | 0.15 | 0.15 | 0.15 |
| InGaN barrier layer | 125a | 0 | 0 | 0 | 0 |
| P-GaN clad layer | 113 | — | — | — | — |

EMBODIMENT

THIRD COMPARATIVE EXAMPLE

SEMICONDUCTOR LIGHT EMITTING DEVICE

CROSS REFERENCE TO RELATED APPLICATION

This application is based upon and claims the benefit of priority from the prior Japanese Patent Application No. 2012-046048 filed on Mar. 2, 2012, and No. 2012-050027 filed on Mar. 7, 2012, the entire contents of which are incorporated herein by reference.

FIELD

Embodiments described herein relate generally to a semiconductor light emitting device.

BACKGROUND

In the background art, some light emitting devices of nitride semiconductor are configured to have a light emitting layer of nitride semiconductor that includes a multiple quantum well structure with quantum well layers and barrier layers each laminated alternately so that the main surface of the light emitting layer is a polar face; and current flows in a direction substantially vertical to the main surface.

The light emitting devices employ an InGaN well layer; and a GaN barrier layer or an InGaN barrier layer whose In-composition is lower than that of the InGaN well layer. The InGaN well layer is compressed because InGaN has a lattice constant larger than that of GaN.

A piezo electric field arises from compression strain. The piezo electric field separates holes and electrons both injected into the InGaN well layer spatially from each other to prevent radiative recombination.

An InGaN well layer with a thickness of 3 nm or less is often employed to prevent a reduction in the radiative recombination due to the piezo effect. Thinning the InGaN well layer causes holes and electrons to approach each other, thereby preventing the reduction in the radiative recombination of holes and electrons.

Unfortunately, driving a semiconductor light emitting device having an InGaN well layer that is 3 nm or less with a large current could cause excessively high carrier density in the InGaN well layer. As a result, an Auger recombination exceeds the radiative recombination. The Auger recombination increases with the cube of carrier density whereas the radiative recombination increases with the square thereof. Furthermore, carriers overflowing from the InGaN well layer increases. Thus, internal light emission efficiency decreases to cause a problem that semiconductor light emitting devices having a high optical output are not enabled.

In the background art, some light emitting devices of nitride semiconductor are configured to have a light emitting layer that includes a multiple quantum well structure with quantum well layers and barrier layers each laminated alternately so that current flows in a direction substantially vertical to the main surface of the light emitting device. The light emitting layer is provided between N-type and P-type semiconductor layers.

The semiconductor light emitting devices are each configured to have two or more barrier layers whose band gaps are equal to each other. Holes and electrons are injected into the semiconductor light emitting layers in the multiple quantum well structure from the sides of the P-type semiconductor layer and the N-type semiconductor layer, respectively.

Heavy holes stay mostly in the quantum well layers near the P-type semiconductor layer whereas light electrons reach the quantum well layers near the P-type semiconductor layer. As a result, the holes and the electrons are more likely to recombine with each other in the quantum well layers near the P-type semiconductor layer.

Holes and electrons could be confined to just one thin quantum layer to give rise to excessively high carrier density in some cases. This causes a problem that non-radiative Auger recombination proportional to the cube of the carrier density is more than radiative recombination proportional to the cube thereof, thus decreasing optical output.

BRIEF DESCRIPTION OF THE DRAWINGS

Aspects of this disclosure will become apparent upon reading the following detailed description and upon reference to accompanying drawings.

DETAILED DESCRIPTION

Figure 1A:
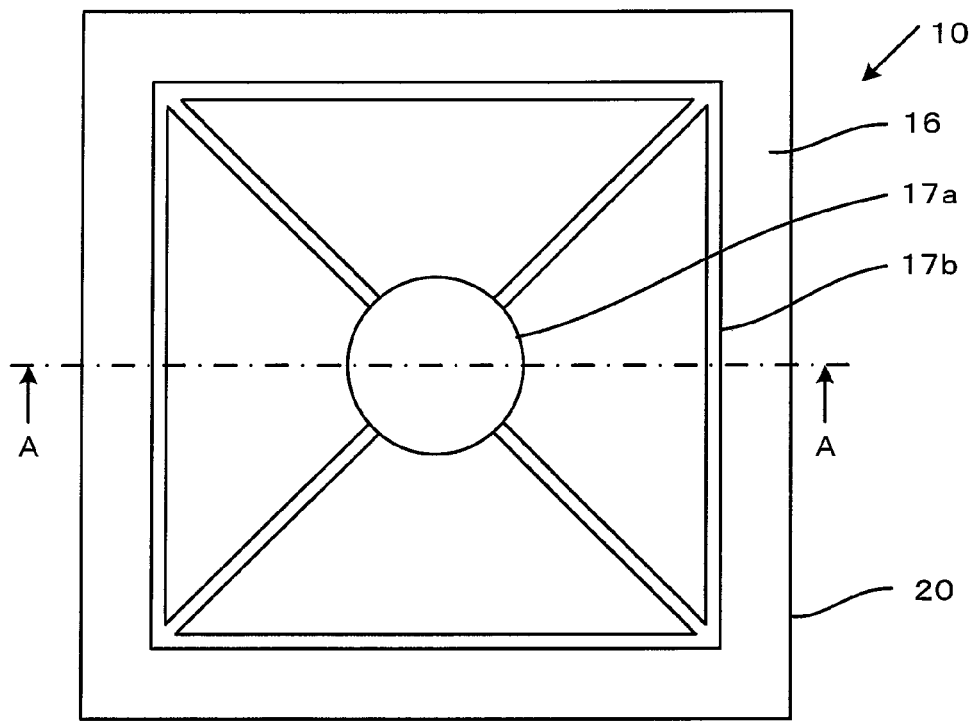
FIGS. 1A and 1B are views illustrating a semiconductor light emitting device according to a first embodiment.

As will be described below, in accordance with an embodiment, a semiconductor light emitting device includes a first conductivity-type first semiconductor layer, a second conductivity-type second semiconductor layer, a semiconductor light emitting layer, and first and second electrodes. The semiconductor light emitting layer is provided between the first semiconductor layer and the second semiconductor layer, and includes a multiple quantum well structure. The quantum well structure includes well layers and barrier layers each laminated alternately, each of the well layers being not less than 6 nm and not more than 10 nm. The first and second electrodes are electrically connected to the first and second semiconductor layers such that current flows in a direction substantially vertical to the main surface.

In accordance with another embodiment, a semiconductor light emitting device includes an N-type semiconductor layer, a P-type semiconductor layer, a semiconductor light emitting layer, an N-side electrode and a P-side electrode. The semiconductor light emitting layer is formed between the N-type semiconductor layer and the P-type semiconductor layer; and includes a multiple quantum well structure. The quantum well structure includes well layers and barrier layers each laminated alternately. The N-side electrode and the P-side electrode are electrically connected to the N-type semiconductor layer and the P-type semiconductor layer such that current flows in a direction substantially vertical to a main surface of the semiconductor light emitting layer. In addition, one of the barrier layers nearest to the P-type semiconductor layer has a narrower band gap than the rest of the barrier layers, the barrier layers being each sandwiched between the well layers.

An embodiment will be described with reference to the drawing below. Wherever possible, the same reference numerals will be used to denote the same or like parts throughout figures.

First Embodiment

Figure 1B:
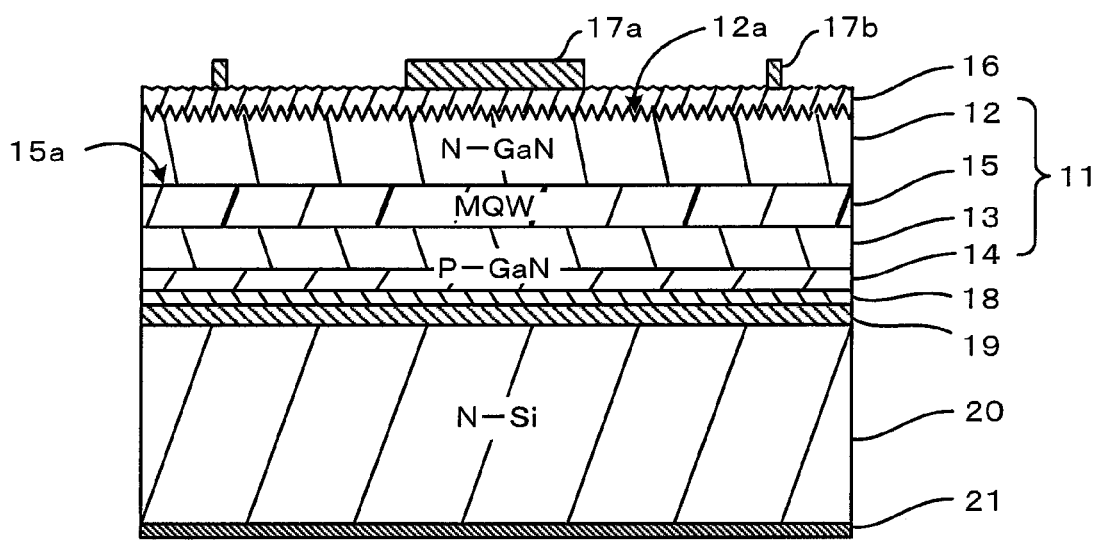

A light emitting device in accordance with a first embodiment will be described with reference to FIGS. 1A and 1B. FIGS. 1A and 1B are views showing the light emitting device in accordance with the first embodiment. FIG. 1A is a plan view thereof. FIG. 1B is a sectional view cut and viewed along the line A-A in FIG. 1A. The light emitting device of the first embodiment is a blue light emitting diode using InGaN-series nitride semiconductors.

As shown in FIGS. 1A and 1B, a semiconductor light emitting device 10 includes a semiconductor lamination body 11. The semiconductor lamination body 11 includes an N-type GaN clad layer 12; a P-type GaN clad layer 13 and a P-type GaN contact layer 14; and a semiconductor light emitting layer 15. The N-type GaN clad layer 12 is a first-conduction-type first semiconductor layer. The P-type GaN clad layer 13 and the P-type GaN contact layer 14 are second-conduction-type second semiconductor layers. The semiconductor light emitting layer 15 is provided between the N-type GaN clad layer 12 and the P-type GaN clad layer 13.

As will be described later, the semiconductor lamination body 11 is epitaxially grown on a sapphire substrate whose plane direction represents a C-plane. The growth front (main surface) of the semiconductor lamination body 11 is a C-plane. The semiconductor light emitting layer 15 is a C-plane and a polar face.

The N-type GaN clad layer 12 has a concave-convex portion 12*a* on the opposite side of the semiconductor light emitting layer 15. Light that have entered the concave-convex portion 12*a* from the side of the semiconductor light emitting layer 15 is scattered or refracted at the concave-convex portion 12*a* to be extracted from the N-type GaN clad layer 12. The concave-convex portion 12*a* enhances the optical extraction efficiency of extracting light from the upper surface of the N-type GaN clad layer 12.

A transparent conductive film (first electrode) 16 is provided on the concave-convex portion 12*a* of the N-type GaN clad layer 12. The conductive layer 16 is transparent to light emitted from the light emitting layer 15. The transparent conductive film 16 is formed on the substantially entire surface of the concave-convex portion 12*a* of the N-type GaN clad layer 12.

The transparent conductive film 16 has a concave-convex surface that reflects the concave-convex portion 12*a* of the N-type GaN clad layer 12 on the opposite side of the light emitting layer 15.

The transparent conductive film 16 includes an ITO (Indium Tin Oxide) film having a thickness of 100 to 200 nm, for example. Current can spread spatially to the periphery of the semiconductor lamination body 11 owing to the transparent conductive film 16. It is preferable to thicken the ITO film for spreading the current. Meanwhile, it is preferable to thin the ITO film because an ITO film absorbs light slightly. A transparent conductive film is referred to also as an ITO film below.

In addition, a P-type nitride semiconductor has resistivity larger than that of transparent conductive films including an ITO film, and is difficult to grow thick so that the P-type nitride semiconductor has high sheet resistance. Current will spread mostly through the transparent conductive film 16. A spread of the current that passes through the P-type GaN layers, such as the P-type GaN clad layer 13 and the P-type GaN contact layer 14, can be neglected.

A pad electrode 17a is formed for bonding wire at the center of the transparent conductive film 16. A line frame and a thin wire electrode 17b are formed on the transparent conductive film 16. The line frame runs along the outer periphery of the transparent conductive film 16. The thin wire electrode 17b is formed in an X-shaped line such that the thin wire electrode 17b extends from the pad electrode 17a in the four diagonal directions and is in contact with the four corners of the line frame. The thin wire electrode 17b is formed as being a 2 μm-wide Au film, for example.

The transparent conductive film 16 has sheet resistance much higher than that of the thin wire electrode 17b to thereby make the spread of the current worse when the semiconductor lamination body 11 becomes larger. The thin wire electrode 17b is provided for enhancing the spread of the current due to the transparent conductive film 16.

A metal electrode (second electrode) 18 is formed on the P-type GaN contact layer 14 on the opposite side of the semiconductor light emitting layer 15. The metal electrode 18 is formed on the substantially entire surface of the P-type GaN contact layer 14. The metal electrode 18 is a laminated film including silver (Ag) and gold (Au) layers both allowing ohmic contact with the P-type GaN layer. The Ag layer has a high optical reflectance to reflect light from the semiconductor light emitting layer 15.

The semiconductor lamination body 11 is formed on the metal electrode 18 over the support substrate 20 so that the bonding layer 19 is sandwiched between the metal electrode 18 and the support substrate 20. The bonding layer 19 is a gold-tin (AuSn) alloy layer, for example. The support substrate 20 is a silicon substrate, for example.

The support substrate 20 is provided with a substrate electrode 21 on the opposite side of the semiconductor lamination body 11. The substrate electrode 21 is a gold film allowing ohmic contact with silicon.

Figure 2:
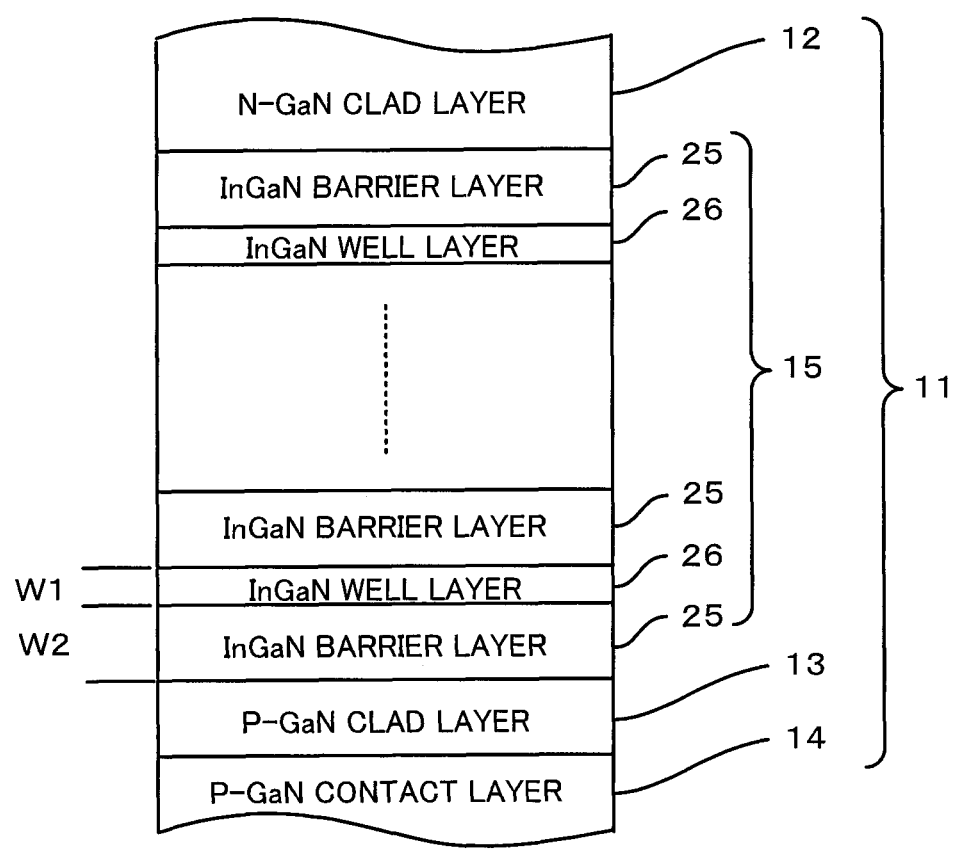
FIG. 2 is a cross-sectional view illustrating the main portion of the semiconductor light emitting device according to the first embodiment.

As shown in FIG. 2, the semiconductor light emitting layer 15 is a quantum well structure with $In_{x1}Ga_{(1-x1)}N$ well layers 26 and $In_{x2}Ga_{(1-x2)}N$ barrier layers 25 each laminated alternately. Hereinafter, the $In_{x1}Ga_{(1-x1)}N$ well layers 26 and $In_{x2}Ga_{(1-x2)}N$ barrier layers 25 are referred to simply as InGaN well layers and InGaN barrier layers, respectively. The semiconductor light emitting layer 15 has an InGaN barrier layer as a starting layer and an InGaN barrier layer as a terminal layer.

The parameters x1 and x2 satisfy a relation of $0 \leq x2 < x1 < 1$. The In-compositions x1 of the InGaN well layers 26 are each set to about 0.15 so that light with a wavelength of 450 nm is emitted from the semiconductor light emitting device 10. The In-compositions x2 of the InGaN barrier layers 25 are each set to 0.05 so that the band gaps of each InGaN barrier layers 25 become wider than the band gaps of each InGaN well layers 26.

The thicknesses W1 of the InGaN well layers 26 are each set to not less than 6 nm and not more than 10 nm. Preferably, the thicknesses W1 are each set to not less than 8 nm and not more than 9 nm. The InGaN well layers 26 are only required to include two or more layers. The thicknesses W2 of the InGaN barrier layers 26 are each set to 5 nm to 20 nm, for example.

The thickness and impurity concentration of the N-type GaN clad layer 12 are set to, for example, 2 to 5 μm and $1 \times 10^{19}$ cm$^{-3}$, respectively. The N-type GaN clad layer 12 serves as a single-crystal underlayer to epitaxially grow layers from the semiconductor light emitting layer 15 to the P-type GaN contact layer 14.

The P-type GaN clad layer 13 is 100 nm in thickness and has an impurity concentration of $1 \times 10^{20}$ cm$^{-3}$, for example. The P-type GaN contact layer 14 is 10 nm in thickness and an impurity concentration of $1 \times 10^{21}$ cm$^{-3}$, for example.

Applying a voltage between the pad electrode 17a and the substrate electrode 21 causes a current to passthrough the semiconductor light emitting layer 15 in a direction substantially vertical to the main surface 15a. The carriers injected into the InGaN well layer 26 radiatively recombine to emit light with a peak wavelength of about 450 nm.

The semiconductor light emitting device 10 mentioned above is configured to make the InGaN well layer 26 thicker than 3 nm, i.e., a normal thickness thereas such that the carrier density in the InGaN well layer 26 is prevented from being excessively high when a large current is supplied.

Figure 3:
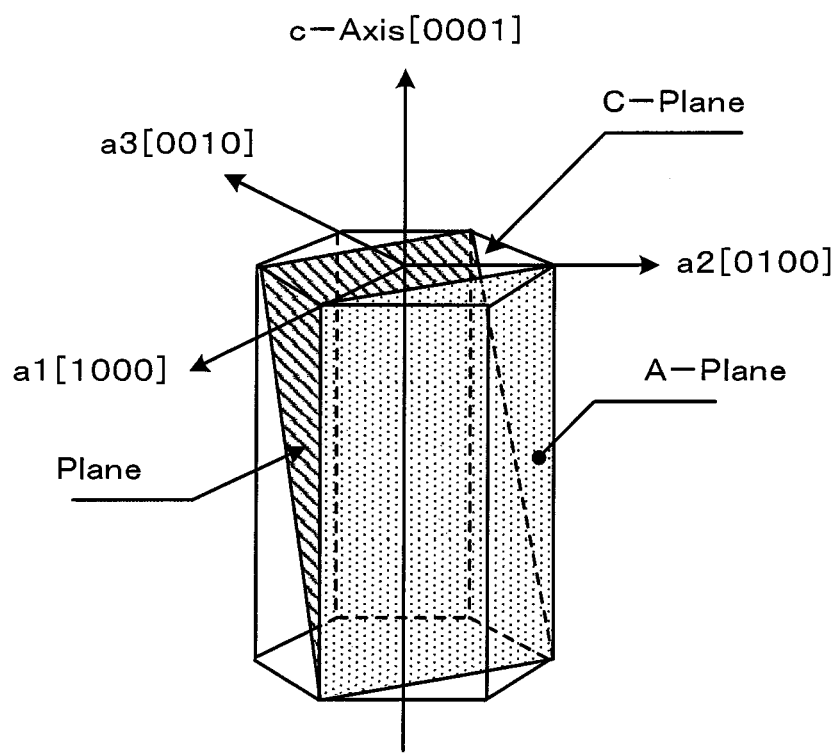
FIG. 3 is a view illustrating a crystal structure of the semiconductor light emitting device according to the first embodiment.

FIG. 3 is a view showing a crystal structure of a nitride semiconductor. As shown in FIG. 3, GaN is a hexagonal wurtzite-type crystal. The main surface 15a of the semiconductor light emitting layer 15 is a C-plane (0001), and is a polar face. InGaN laminated on GaN has lattice spacing larger than that of GaN to be subjected to compression stress and strain. This causes a piezo electric field in the c-axis direction, i.e., growth direction.

Figure 4A:
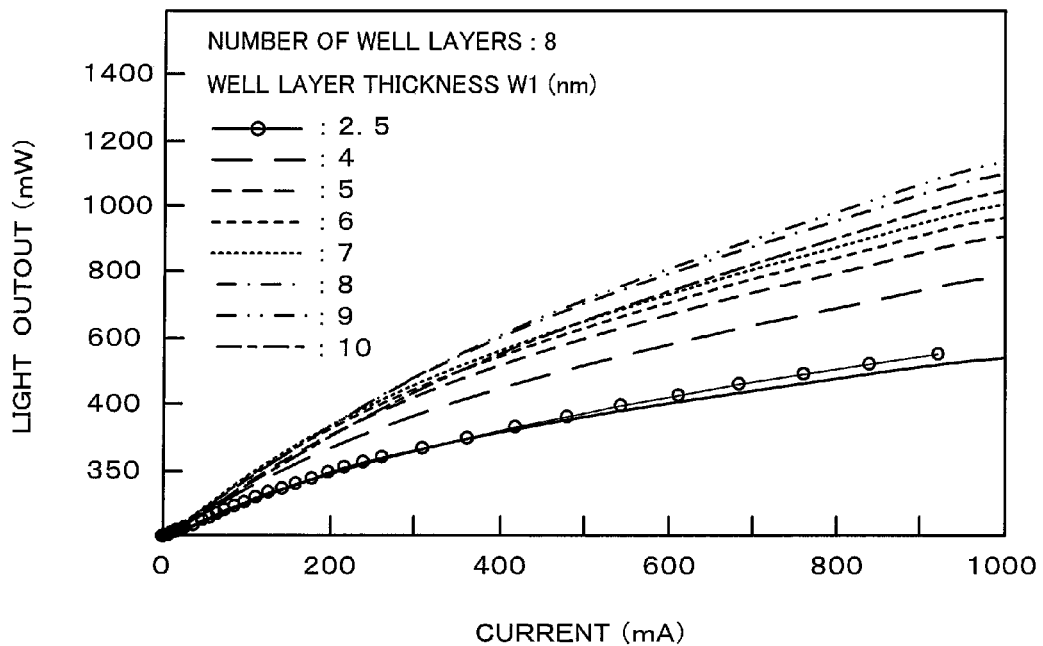
FIGS. 4A to 5 are graphs illustrating characteristics of the semiconductor light emitting device according to the first embodiment.
Figure 4B:
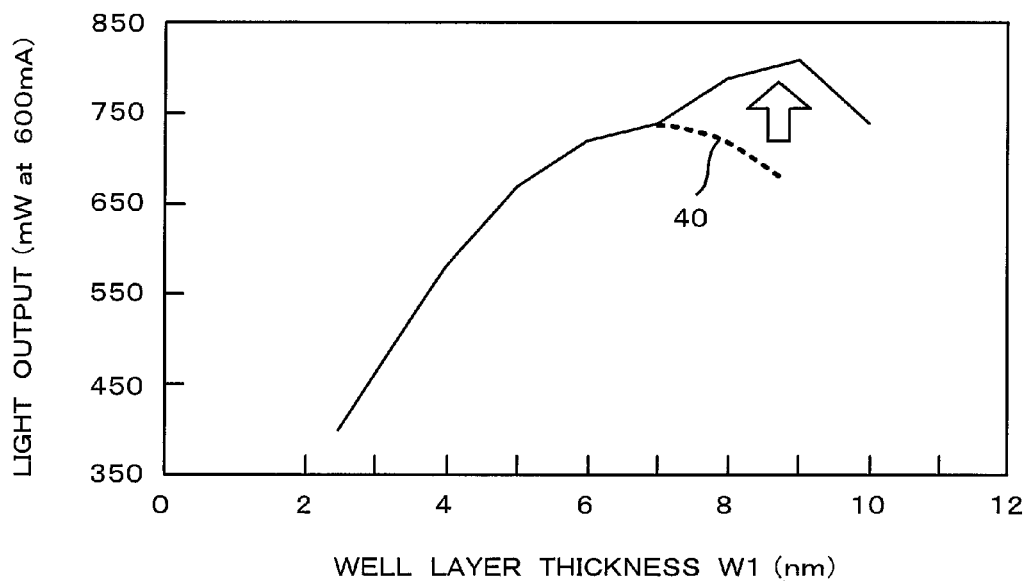
Figure 5:
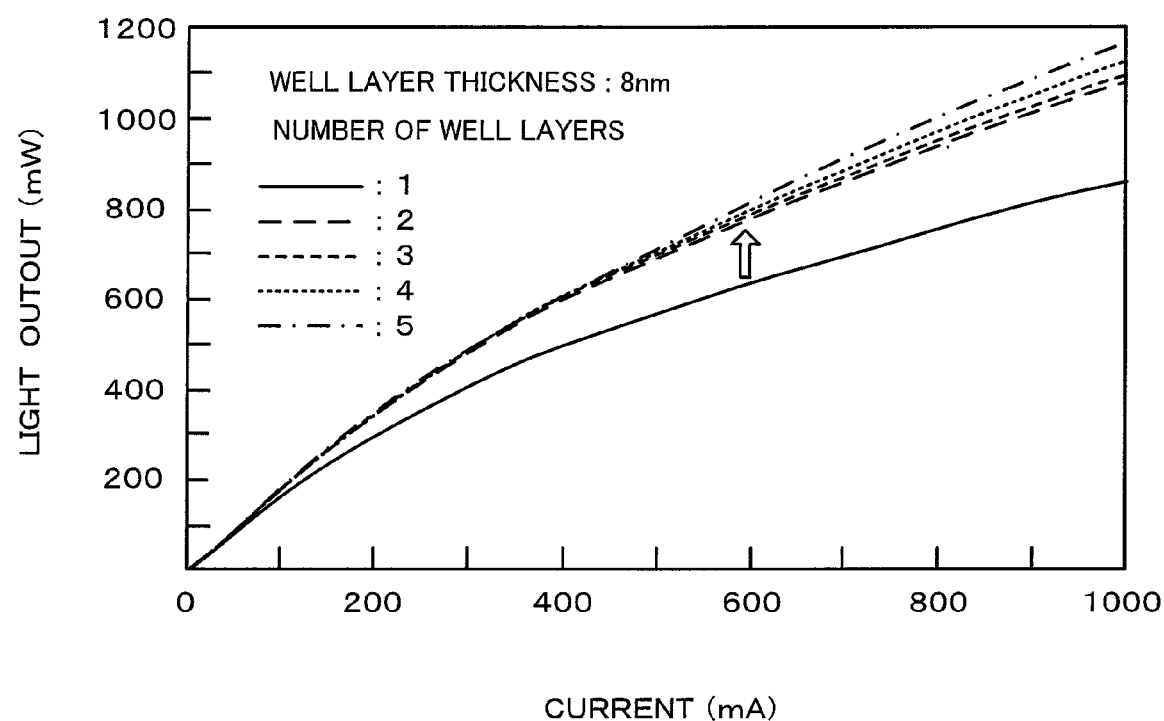

FIGS. 4A to 5 are views showing simulations for light output of the semiconductor light emitting device 10. The simulation involves the above-mentioned piezo electric field.

FIG. 4A is a view showing a relation of Current vs Light Output with the thickness W1 of each InGaN well layer 26 as a parameter. FIG. 4B is a view showing a relation of Well Layer Thickness W1 vs Light Output.

As initial conditions, the thickness of each InGaN barrier layer 25 and the number of the InGaN well layers 26 are set to 5 nm and 8, respectively. The thickness W1 of the InGaN well layer 26 ranges from 2.5 nm to 10 nm. A semiconductor light emitting device that includes 2.5 nm-thick InGaN well layers is regarded as a comparative example. The white circle shows the experimental result of the semiconductor light emitting device of the comparative example.

As shown in FIG. 4A, the light output monotonically increases with increasing current in the thickness W1 of the InGaN well layer 26 from 2.5 nm to 10 nm while showing a tendency to saturate therein. When the thickness W1 of the InGaN well layer 26 is 2.5 nm, the output coincides well with the result of the semiconductor light emitting device of the comparative example. The coincidence shows the validity of the simulation.

When the thickness W1 of the InGaN well layer 26 is in the range from 4 nm to 10 nm, the output is much higher than the experimental result (denoted by white dots) of the semiconductor light emitting device of the comparative example. The output increases 1.5 times to twofold from that of the comparative example.

As shown in FIG. 4B, the light output tends to increase as a whole in response to the thickness W1 of the InGaN well layer 26. Specifically, the light output basically increases while showing a tendency that the light output transiently saturates around at a thickness W1 of 6 to 7 nm.

When the thickness W1 of the InGaN well layer 26 is further increased to 8 nm to 9 nm, the light output further shows a tendency that the light output starts to increase again from the transient saturation. Immediately after the thickness W1 of the InGaN well layer 26 has reached 10 nm, the light output starts to decrease.

The relation of the thickness W1 of the InGaN well layer 26 versus the light output shows a peak thickness of 9 nm. Specifically, the light output approximately doubles when the thickness W1 of the InGaN well layer 26 ranges from 8 nm to 9 nm. The light output increases by 1.8 times when the thickness W1 of the InGaN well layer 26 is 6 nm.

The above-mentioned tendency has revealed that the light output is notably high when the thickness W1 of the InGaN well layer 26 is 8 nm to 9 nm. The tendency probably shows a critical property that is not expected simply from a fitting curve 40 denoted by the dotted line. The fitting curve is obtained by fitting the curve of the light output in the thickness W1 of the InGaN well layer 26 ranging from 2.5 nm to 6 nm.

Meanwhile, immediately after the thickness W1 of the InGaN well layer 26 has reached 10 nm, the light output starts to decrease, which is not negligible. As a result, the preferable thickness W1 of the InGaN well layer 26 is not less than 6 nm and not more than 10 nm. More preferably, the thickness W1 of the InGaN well layer 26 is not less than 8 nm and not more than 9 nm.

A nitride semiconductor light emitting device having a thick InGaN well layer reduces its light output probably because holes and electrons are spatially separated owing to the piezo effect to prevent the radiative recombination thereof.

When current is passed through a semiconductor light emitting layer in a direction substantially vertical to the main plane of the semiconductor light emitting layer, and the semiconductor light emitting layer is near the electrode; voltage is applied substantially directly to the semiconductor light emitting layer. As a result, the current without a component that obliquely passes through the semiconductor light emitting layer generates more holes and electrons in the light emitting layer, e.g., the InGaN well layer, than the same current with the component.

In the present embodiment, holes and electrons are injected into the semiconductor light emitting layer 15 from the P-type GaN clad layer 13 and the N-type GaN clad layer 12, respectively. That is, holes and electrons are injected from the sides opposite to each other. Holes having a large effective mass stay inside the semiconductor light emitting layer on the side of the P-type GaN clad layer 13 whereas electrons having a small effective mass reach the semiconductor light emitting layer on the side of the P-type GaN clad layer 13.

As a result, the holes and the electrons are likely to recombine with each other in the InGaN well layers 26 on the side of the P-type GaN clad layer 13. Holes and electrons are confined to just one InGaN well layer 26 to give rise to excessively high carrier density when the one InGaN well layer 26 is thin.

The excessively high carrier density decreases optical output as a result of the non-radiative Auger recombination or carrier overflow. The Auger recombination increases with the cube of the carrier density whereas the radiative recombination increases with the square thereof. Thus, the Auger recombination exceeds the radiative recombination.

Accordingly, setting the thickness W1 of the InGaN well layer 26 to 6 nm or more reduces the carrier density therein, thereby preventing the Auger recombination to enhance light output: Setting the thickness W1 of the InGaN well layer 26 to 8 nm or more further enhances the light output probably because the carrier overflow is prevented. Setting the thickness W1 of the InGaN well layer 26 to 10 nm or more adversely decreases the light output probably because a quantum effect decreases.

FIG. 5 is a view showing a relation between current and light output with the number of the InGaN well layers 26 as a parameter. As initial conditions, the thicknesses W1 and W2 of the InGaN well layer 26 and the InGaN barrier layer 25 are 8 nm and 5 nm, respectively. The number of the InGaN well layers 26 ranges from 1 to 5.

As shown in FIG. 5, the light output of the semiconductor light emitting device 10 increases with increasing the number of the InGaN well layers 26. The number of the InGaN well layers 26 has an influence on the light output. A large difference is seen between the number being just 1 and the number ranging from 2 to 5.

When the injection current is 600 mA, the light output of the semiconductor light emitting devices 10 having 2 to 5 InGaN well layers is 1.3 times higher than that of the semiconductor light emitting device 10 having only one InGaN well layer 26.

The semiconductor light emitting devices 10 having 2 to 5 InGaN well layers 26 show almost no difference of the light output. More specifically, the light output has almost no difference independently of the number of the InGaN well layers 26. When the current is not less than 400 mA, the light output slightly increases as the number of the InGaN well layers 26 increases.

When the number of the InGaN well layers 26 is only one, the carriers concentrate in the one InGaN well layer 26 so that the light output decreases mainly because of the carrier overflow. When the number of the InGaN well layers 26 is two or more, the carriers are dispersed in the respective InGaN well layers 26 to prevent the carrier overflow.

Accordingly, the more the number of the InGaN well layers 26, the higher the light output. The increment of the light output is however small in the range of sufficiently many InGaN well layers 26 so that just two or more are sufficient as the number of the InGaN well layers 26.

Next, a method of manufacturing the semiconductor light emitting device 10 will be explained with reference to FIGS. 6A to 8B. FIGS. 6A to 8B are cross-sectional views illustrating the steps of manufacturing the semiconductor light emitting device 10 in sequential order.

Figure 6A:
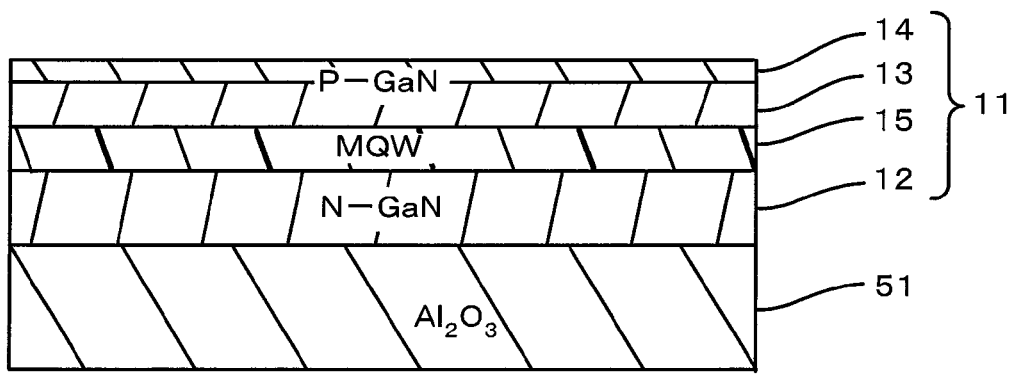
FIGS. 6A to 8B are cross-sectional views illustrating the steps of manufacturing the semiconductor light emitting device in sequential order according to the first embodiment.

As shown in FIG. 6A, the N-type GaN clad layer 12, the light emitting layer 15, the P-type GaN clad layer 13 and the P-type GaN contact layer 14 are epitaxially grown on a sapphire substrate 51 with a C-plane of a plane direction for epitaxial growth in the order by MOCVD (metal organic chemical vapor deposition) method so as to form the semiconductor laminated body 11.

The process of forming the semiconductor laminated body 11 is briefly described below. As a preliminary treatment, a sapphire substrate 51 is subjected to organic cleaning and acid cleaning, for example. The resultant sapphire substrate 51 is contained in a reaction chamber of the MOCVD system. Thereafter, the temperature of the sapphire substrate 51 is raised to 1100° C., for example, by high-frequency heating in a normal-pressure atmosphere of a mixed gas of a nitrogen ($N_2$) gas and a hydrogen ($H_2$) gas. Thereby, the surface of the sapphire substrate 51 is etched in gas phase, and a natural oxide film formed on the surface of the sapphire substrate 51 is removed.

The N-type GaN layer 12 with a thickness of 4 μm, in which the silicon concentration is 1 E19 cm$^{-3}$, is formed by using the mixed gas of the $N_2$ gas and the $H_2$ gas as a carrier gas while supplying an ammonium ($NH_3$) gas and a trimethyl gallium (TMG) gas, for example, as process gases, and supplying a silane ($SiH_4$) gas, for example, as the N-type dopant.

The temperature of the sapphire substrate 51 is decreased to and kept at 800° C. which is lower than 1100° C., for example, while continuing supplying the $NH_3$ gas with the supply of the TMG gas and the $SiH_4$ gas stopped.

The InGaN barrier layer 25 with a thickness of 5 nm, in which the In composition ratio is 0.05, is formed by using the $N_2$ gas as the carrier gas while supplying the $NH_3$ gas, the TMG gas and a trimethyl indium (TMI) gas as the process gases, for example, and the InGaN well layer 26 with a thickness of 8 nm, in which the In composition ratio is 0.15, is formed while supplying an increased amount of the TMI gas.

The forming of the InGaN barrier layer 25 and the forming of the InGaN well layer 26 are alternately repeated 2 times, for example, while increasing or decreasing the supply of the TMI gas. Finally, the InGaN barrier layer 25 is formed. Thereby, the light emitting layer 15 having the MQW structure is obtained.

The undoped GaN cap layer with a thickness of 5 nm (not shown) is formed while continuing supplying the TMG gas and the $NH_3$ gas with the supply of TMI stopped.

The temperature of the sapphire substrate 51 is raised to and kept at 1030° C., for example, which is higher than 800° C., in the $N_2$ gas atmosphere while continuing supplying the $NH_3$ gas with the supply of the TMG gas stopped.

the P-type GaN clad layer 13 with a thickness of 100 nm, in which the concentration of Mg is approximately 1 E20 $cm^{-3}$, is formed by using the mixed gas of the $N_2$ gas and the $H_2$ gas as the carrier gas while supplying: the $NH_3$ gas, the TMG gas as the process gases; and a bis(cyclopentadienyl) magnesium (Cp2Mg) gas as the P-type dopant.

The P-type GaN contact layer 14 with a thickness of approximately 10 nm, in which the concentration of Mg is approximately 1 E21 $cm^{-3}$, is formed while supplying an increased amount of the Cp2Mg gas.

The temperature of the sapphire substrate 51 is lowered naturally with the supply of only the carrier gas continued while continuing supplying the $NH_3$ gas with the supply of the TMG gas stopped. The supplying of the $NH_3$ gas is continued until the temperature of the sapphire substrate 51 reaches 500° C. Thereby, the semiconductor laminated body 11 is formed on the sapphire substrate 51 and the P-type GaN contact layer 14 is located in the top surface.

Figure 6B:
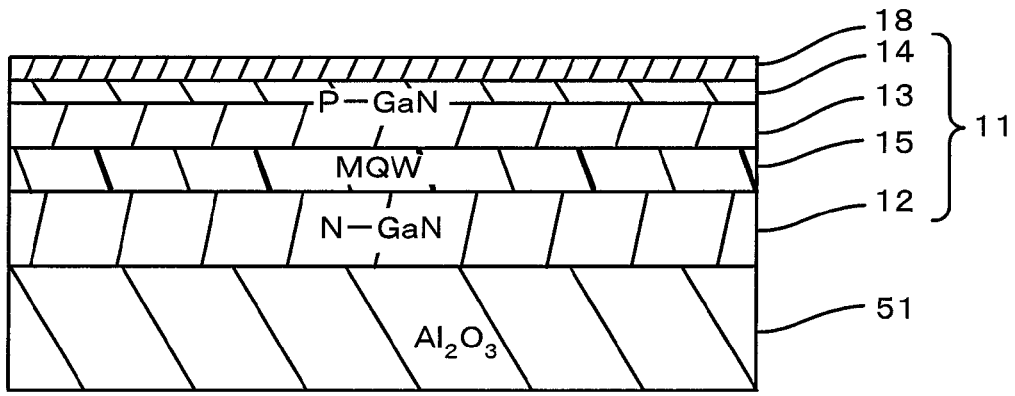

As shown in FIG. 6B, a silver film with a thickness of 0.5 μm and the gold film with a thickness of 1 μm are stacked on the P-type GaN contact layer 14 by a sputtering method so as to form the metal electrode 18.

Figure 6C:
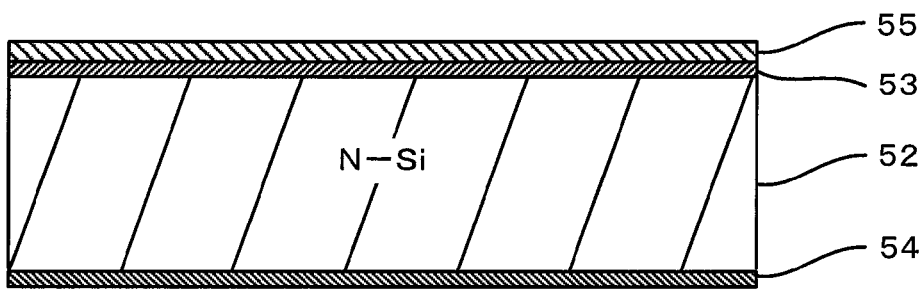

As shown in FIG. 6C, a silicon substrate 52 is prepared. Gold films 53, 54 with a thickness of 1 μm are formed on the both side surfaces of the silicon substrate 52 by sputtering method, for example. A gold tin (AuSn) alloy film 55 is formed on the gold film 53 by vacuum evaporation method, for example. The silicon substrate 52 is the support substrate 20. The gold film 54 is the substrate electrode 21.

Figure 7A:
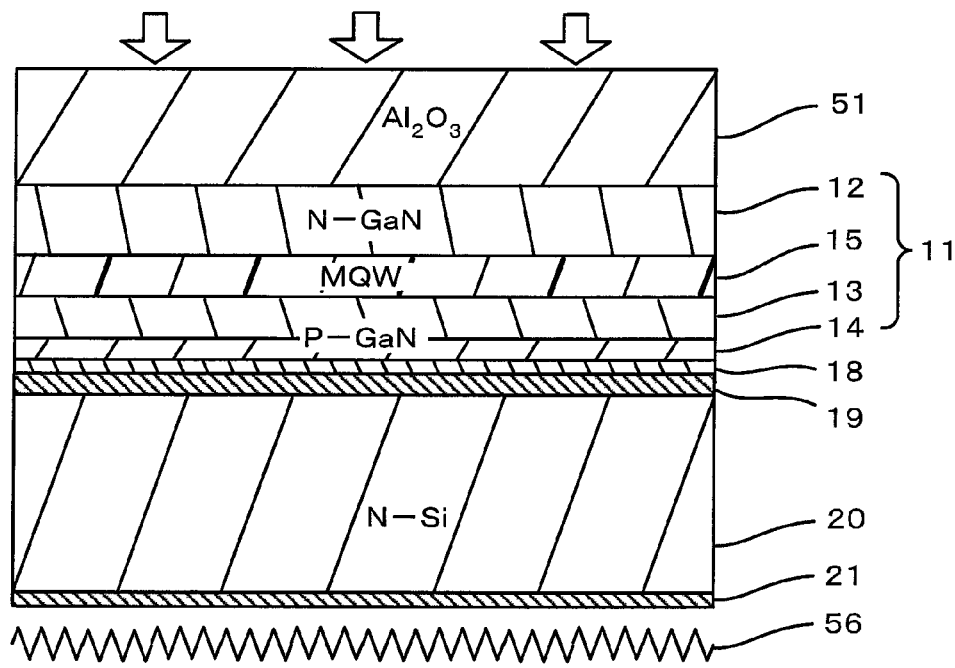

As shown in FIG. 7A, the sapphire substrate 51 is reversed upside down, so that the metal electrode 18 faces the gold tin alloy film 55, and the sapphire substrate 51 and the silicon substrate 52 are placed on each other. Thereafter, the semiconductor laminated body 11 and the substrate 61 are heated and pressed.

Since the gold tin alloy film 55 is melted, the gold film of the metal electrode 18 and the gold film 53 are fused, so that the bonding layer 19 is formed. Thereafter, the sapphire substrate 51 and the silicon substrate 52 are bonded with the bonding layer 19 interposed in between.

Figure 7B:
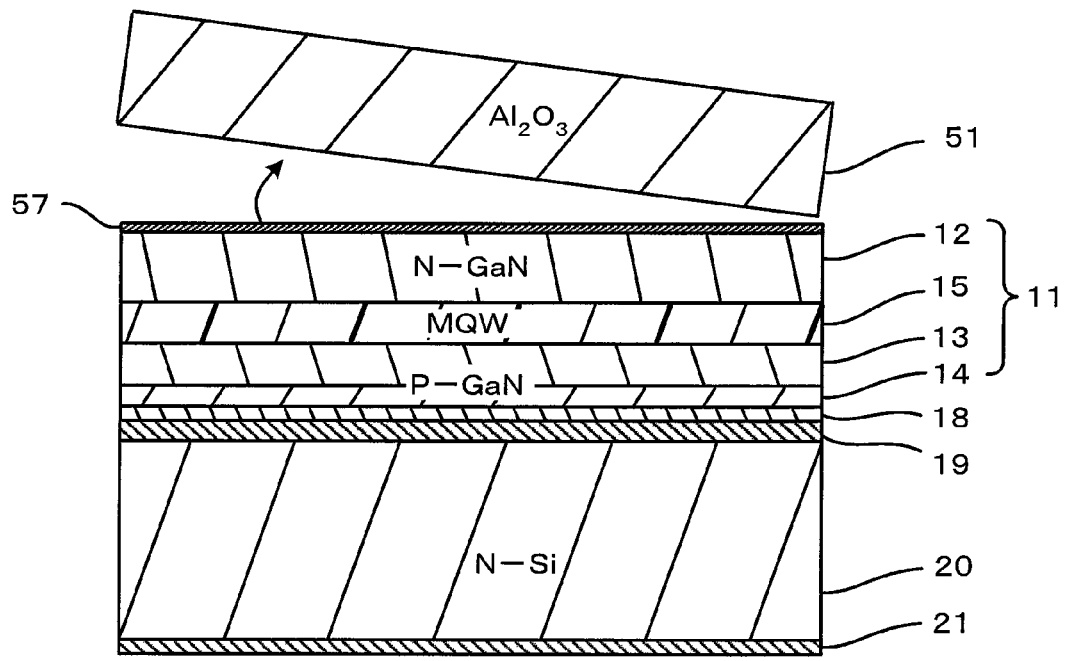

As shown in FIG. 7B, the sapphire substrate 17 and the semiconductor laminated body 11 are separated by laser lift-off method. The laser lift-off method is a method for emitting high-output laser beam to partially decompose inside of a substance by heat application and separating the substance with the decomposed portion being the border.

More specifically, laser beam is emitted, so that the laser beam passes through the sapphire substrate 51 but is absorbed by the N-type GaN clad layer 12, whereby the N-type GaN clad layer 12 is dissociated, and the sapphire substrate 51 and the N-type GaN clad layer 12 are separated.

For example, the fourth harmonic wave (266 nm) of the Nd-YAG laser is emitted from the side of the sapphire substrate 51. Sapphire is transparent to the light, and therefore, the emitted light passes through the sapphire substrate 51 and is effectively absorbed by the N-type GaN clad layer 12.

The N-type GaN clad layer 12 in proximity to the interface with the sapphire substrate 51 includes many crystalline defects, and therefore, substantially all of the absorbed light is converted into heat, and the following reaction occurs.

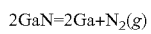

$$2GaN = 2Ga + N_2(g)$$

Accordingly, GaN is dissociated into Ga and $N_2$ gas.

The laser beam may be a continuous wave (CW) or a pulse wave (PW), but the laser beam is preferably a pulse light having a high peak output. A Q switch laser, a mode locked laser, and the like capable of outputting ultra short pulse light in the order of picoseconds to femtoseconds are appropriate as pulse lasers having a high peak output.

Figure 8A:
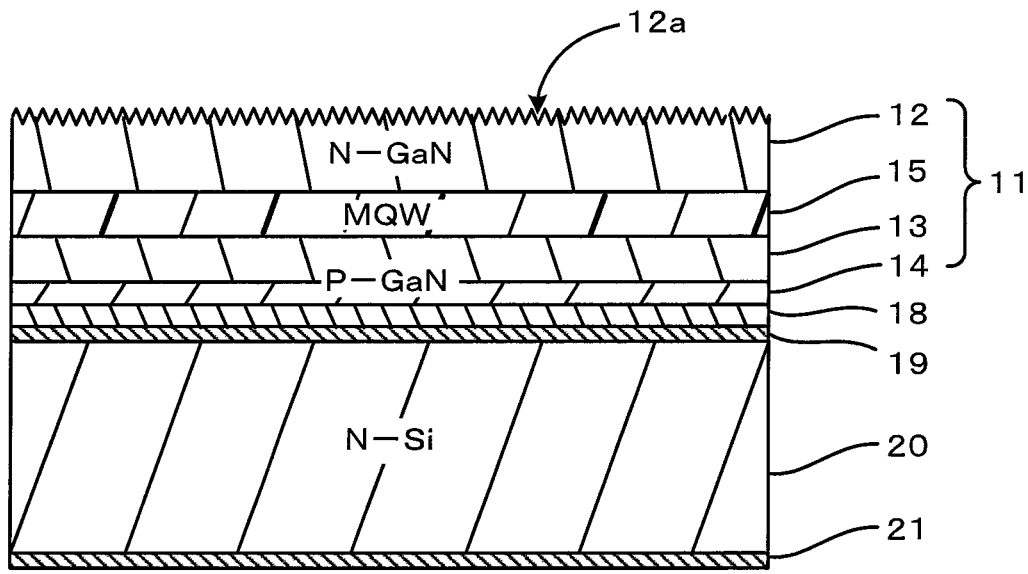

After the dissociation of the N-type GaN clad layer 12; a Ga layer 57 is remained on the exposed N-type GaN clad layer 12. The Ga layer 57 is removed by warm water or an aqueous solution of hydrochloric acid (HCl), As shown in FIG. 8A, the concave-convex portion 12a is formed on the exposed portion of the N-type GaN clad layer 12. Specifically, the N-type GaN clad layer 12 is etched by an aqueous solution of potassium hydroxide (KOH), for example. The KOH aqueous solution is suitable to have, for example, a concentration of approximately 20% to 40% at a temperature of approximately 60° C. to 70° C. Since N polar face of GaN is anisotropically etched by the KOH aqueous solution, the concave-convex portion 12a is formed on the N polar face of GaN.

Figure 8B:
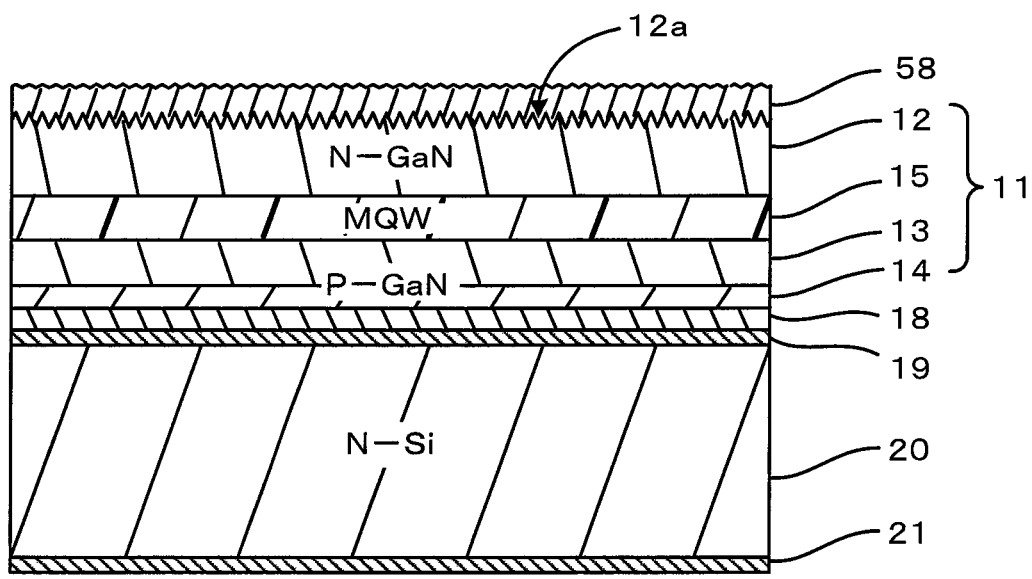

As shown in FIG. 8B, An ITO film 58 with a thickness of 200 nm is formed on the N-type GaN clad layer 12 having the concave-convex portion 12a by sputtering method, for example. The ITO film 58 is subjected to thermal treatment in order to facilitate the crystallization of the ITO film 58 and improve the conductivity of the ITO film 58.

For example, it is appropriate to perform the thermal treatment in nitrogen atmosphere or mixed atmosphere including nitrogen and oxygen at a temperature of about 400 to 750° C. for about one to 20 minutes. In this stage, the ITO film 58 becomes the transparent conductive film 16 shown in FIG. 1B.

A gold film is formed on the transparent conductive film 16 by sputtering method, for example. The gold film is patterned so as to form the pad electrode 17a and the thin wire electrode 17b. Thereby, the light emitting device 10 shown in FIGS. 1A and 1B is obtained.

The thickness W2 of the InGaN barrier layer 25 and the thickness W1 of the InGaN well layer 26 can be estimated using TEM (Transmission Electron Microscope) or X-ray Reflectivity Method.

Cross-sectional TEM observation can directly determine the thickness W2 of the InGaN barrier layer 25 and the thickness W1 of the InGaN well layer 26. The a-axis and c-axis of GaN are about 0.319 nm and about 0.518 nm as lattice constants, respectively. The InGaN well layer 26 with a thickness W1 of 8 nm includes 16 InGaN lattices laminated.

The X ray reflectance method can indirectly determine the thickness W2 of the InGaN barrier layer 25 and the thickness W1 of the InGaN well layer 26. The X ray reflectance method employs extremely oblique incidence of an X ray and analyses an intensity profile of the reflected X ray for determining thicknesses and density of a sample.

Specifically, the extremely oblique incidence of an X ray causes the X ray to reflect at the surface of a film, the interface of the film/the substrate, and each interface in films, so that the X rays reflected at the respective interfaces interfere with each other. The reflectance profile obtained by changing the incidence angle of the X ray continuously shows an oscillatory structure specific to the thickness, density, and interfacial roughness of films. Analysing the reflectance profile on the basis of a theoretical formula can provide evaluations of the thickness, density, and roughness of the films.

A high-brightness parallel beam allows it to evaluate an extremely thin film. Employing an artificial multilayer with a paraboloidal surface as incidence optics can provide such a high-brightness parallel beam.

As described above, in the semiconductor light emitting device 10 of the embodiment, the light emitting layer 15 whose main surface is a polar face and thickness W1 is 8 nm has a MQW structure with the InGaN well layers 26 thicker than 3 nm and the InGaN barrier layers 25 each laminated alternately. The transparent conductive film 16 and the metal electrode 18 are formed such that current flows in a direction substantially vertical to the main surface of the semiconductor light emitting layer 15.

As a result, the carrier density inside the InGaN well layers 26 is properly maintained also during great-current driving, thereby allowing it to prevent the Auger recombination and the carrier overflow. Thus, the semiconductor light emitting device is achieved with high light output.

Figure 9:
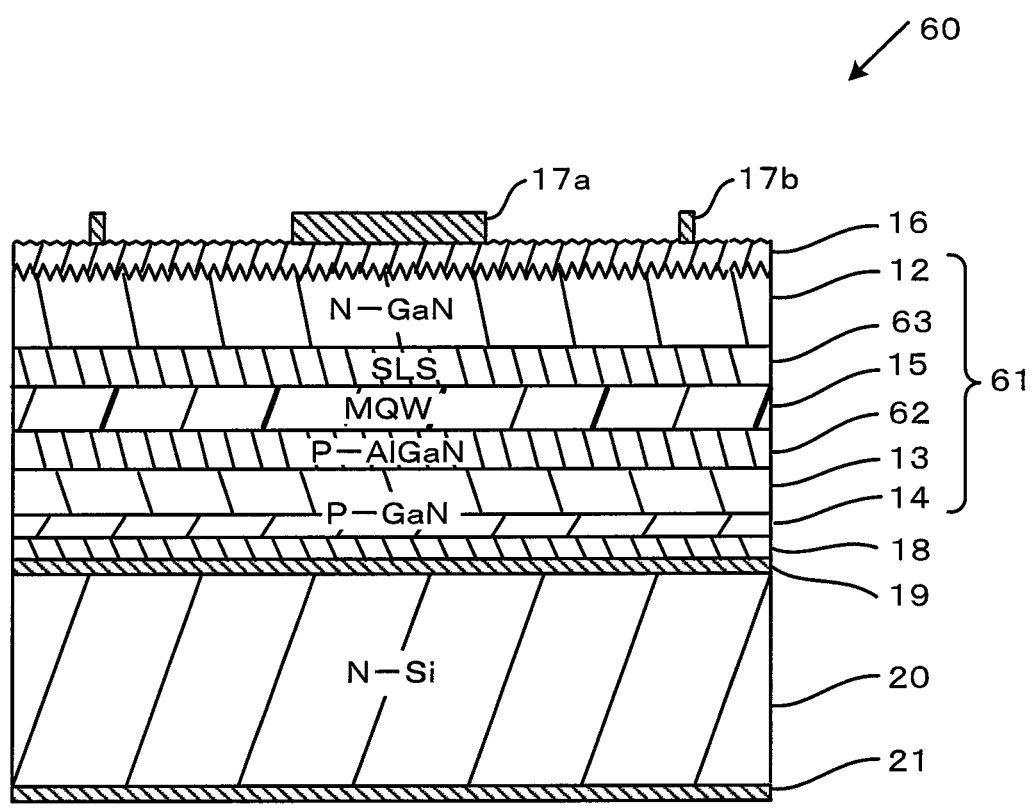
FIGS. 9 and 10 are cross-sectional views illustrating another semiconductor light emitting device according to the first embodiment.

A carrier-overflow prevention layer (overflow prevention layer) can be provided to the semiconductor light emitting device 10. The superlattice buffer layer can be formed to enhance the crystallinity of the semiconductor lamination body 15. FIG. 9 is a sectional view showing a semiconductor light emitting device having the overflow prevention layer and the superlattice buffer layer.

As shown in FIG. 9, a semiconductor lamination body 61 of a semiconductor light emitting device 60 is provided with a P-type AlGaN overflow prevention layer 62 between the semiconductor light emitting layer 15 and the P-type GaN clad layer 13.

The P-type AlGaN overflow prevention layer 62 is 5 nm in thickness; and has an Mg-concentration of $1\times10^{20}$ cm$^{-3}$ and an Al-compositional ratio of 0.2. The P-type AlGaN overflow prevention layer 62 has a wider band gap than the P-type GaN clad layer 13.

A superlattice buffer layer 63 is formed between the semiconductor light emitting layer 15 and the N-type GaN clad layer 12. The superlattice buffer layer 63 has 30 pairs of first and second InGaN layers each laminated alternately, e.g., both being different from each other in In-composition.

The first and second InGaN layers are, e.g., 1 nm and 3 nm in thickness, respectively. The In-composition of the first InGaN layer is higher than that of the second InGaN layer.

The P-type AlGaN overflow prevention layer 62 prevents carriers from overflowing from the InGaN well layer 26 to the P-type GaN clad layer 13. The superlattice buffer layer 63 prevents lattice defects such as dislocations from propagating from the N-type GaN clad layer 12 to the semiconductor light emitting layer 15. As a result, the light output of the semiconductor light emitting device 60 is further enhanced.

Although the above described has assumed a silicon substrate as the support substrate 20, the support substrate 20 can employ other conductive substrates. The conductive substrates include a metal substrate, a conductive ceramic substrate, and a germanium (Ge) substrate. The conductive ceramic substrate is a SiC ceramic substrate, for example.

Although the above-described has assumed that the substrate for the semiconductor lamination body 11 to be grown thereon is a C-plane of the sapphire substrate, conductive substrates may be employed for the substrate. The conductive substrates for the semiconductor lamination body 11 include a GaN substrate whose main surface is a C-plane; a SiC substrate; and a ZnO substrate.

Figure 10:
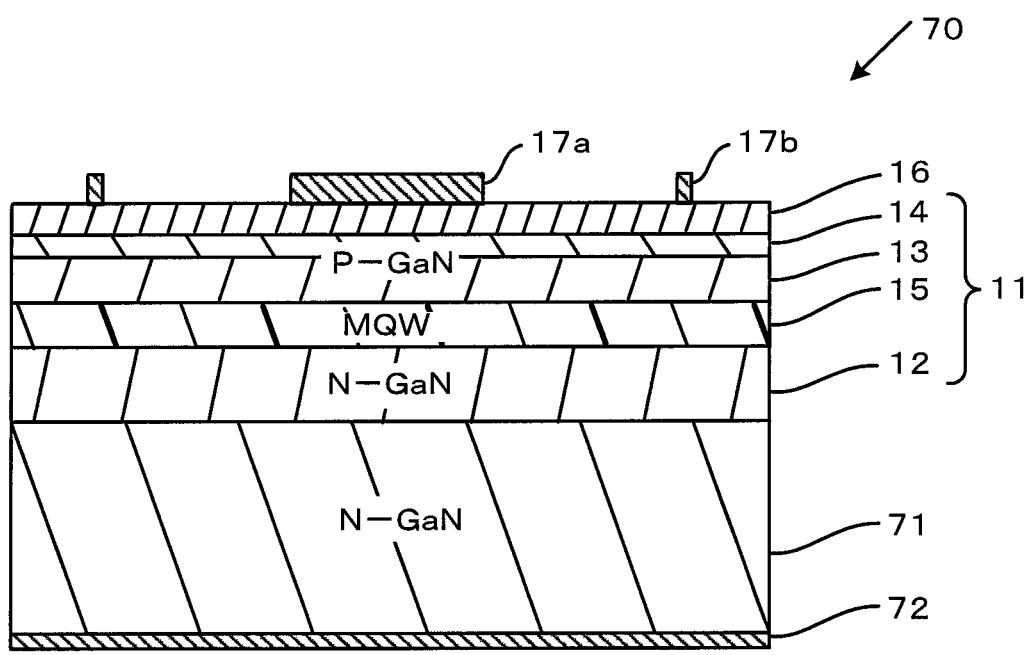

FIG. 10 is a sectional view showing a semiconductor light emitting device having a semiconductor lamination body. As shown in FIG. 10, the semiconductor light emitting device 70 has a semiconductor lamination body 11 that is formed on the conductive growth substrate 71 whose main surface is a C-plane, e.g., the C-plane of the GaN substrate.

The N-type GaN clad layer 12, the semiconductor light emitting layer 15, the P-type GaN clad layer 13, and the P-type GaN contact layer 14 are formed on the conductive substrate 71 in this order. The transparent conductive film 16 is formed on the P-type GaN contact layer 14.

The substrate electrode 72 is formed on the opposite side of the conductive substrate 71 from the N-type GaN clad layer 12. The substrate electrode 72 is, a Ti/Pt/Au film that allows ohmic contact with the N-type GaN.

The conductive substrate 71 can serve as both a growth substrate and a support substrate. The conductive substrate 71 advantageously eliminates the needs for contacting of the support substrate and removing of the growth substrate.

Alternatively, a current block layer for the pad electrode 17a and the thin wire electrode 17b may be formed between the P-type GaN contact layer 14 and the transparent conductive film 16.

Figure 11:
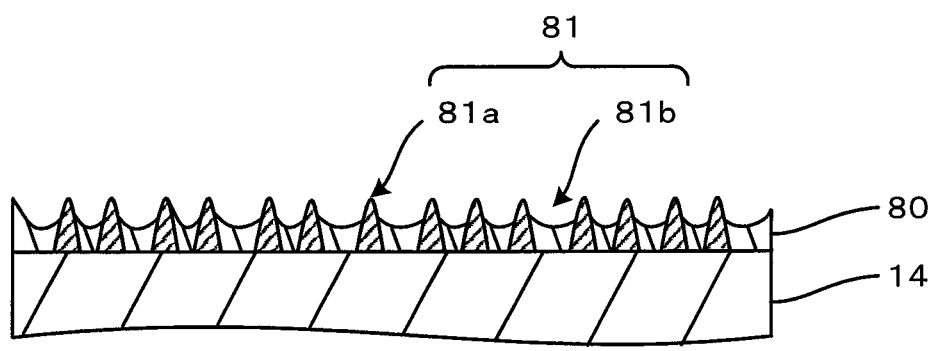
FIG. 11 is a cross-sectional view illustrating a main portion of another semiconductor light emitting device according to the first embodiment.

Further, the transparent conductive film 16 can have a concave-convex portion to improve the light extraction efficiency. FIG. 11 is a cross-sectional view illustrating a main portion of a semiconductor device having a transparent conductive film with a concave-convex portion.

As shown in FIG. 11, a, transparent conductive film 80 has a concave-convex portion 81 including both a convex portion 81a which is mainly a crystalline ITO and a concave portion 81b which is mainly an amorphous ITO.

It is generally known that when an ITO film is formed by sputtering or the like method, it is possible to obtain the ITO film in which amorphous ITO and crystalline ITO mixedly exist depending on the temperature of substrate, the plasma density, the partial pressure of oxygen, and the like at the time of film formation.

With regard to the temperature of the substrate, for example, the crystalline temperature of ITO is in a range of 150° C. to 200° C. When the temperature of the substrate is near the crystalline temperature, it is possible to obtain the ITO film in which amorphous ITO and crystalline ITO mixedly exist.

Through cross-sectional TEM (Transmission Electron Microscope) observation and electron-beam diffraction patterns, it is confirmed that crystalline ITO and amorphous ITO mixedly exist in the ITO film in such a way that pillar-shaped bodies of the crystalline ITO are dispersed, and are surrounded by the amorphous ITO.

The etching rate of the crystalline ITO is smaller than the etching of the amorphous ITO. The etching rate of the crystalline ITO is in a range of approximately 50 nm/min to 100 nm/min, for example. The etching of the amorphous ITO is in a range of approximately 100 nm/min to 500 nm/min, for example. Hence, the selective etching rate of the crystalline ITO to the amorphous ITO is estimated to range from approximately 2 to 5.

The transparent conductive film 80 with the concave-convex portion 81 is obtained by selectively removing the amorphous ITO with the larger etching rate while leaving the crystalline ITO with the smaller etching rate by use of the difference between the etching rate of the crystalline ITO and the etching of the amorphous ITO.

In addition, it is preferable that the transparent conductive film 80 is thickly formed beforehand predicting the reduction of the thickness by etching.

Second Embodiment

Figure 12A:
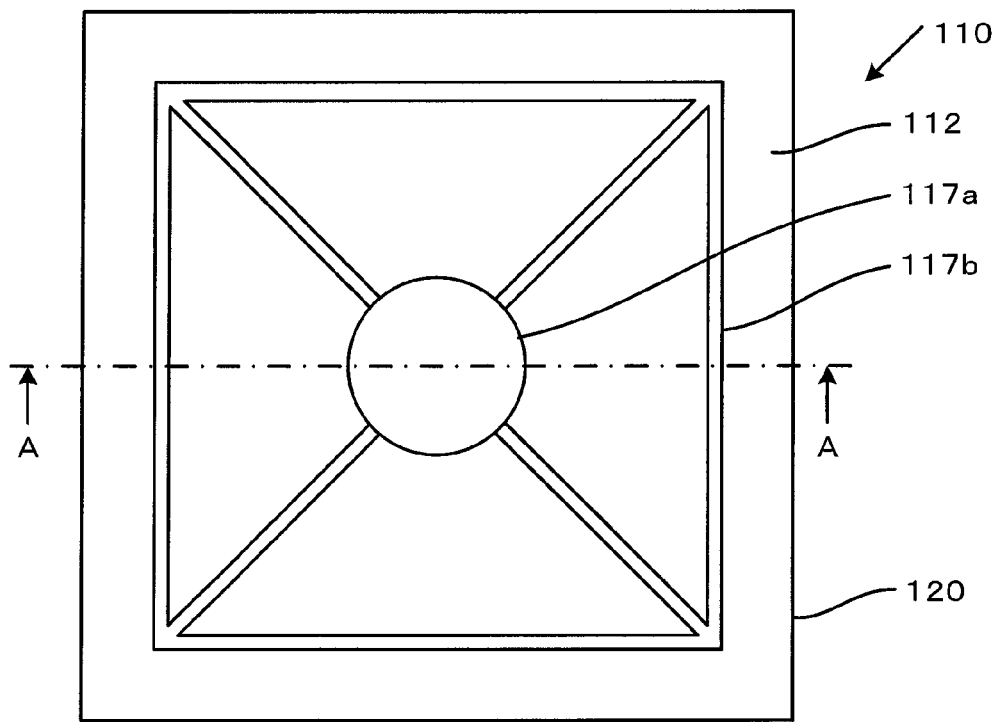
FIGS. 12A and 12B are views illustrating a semiconductor light emitting device according to a second embodiment.
Figure 12B:
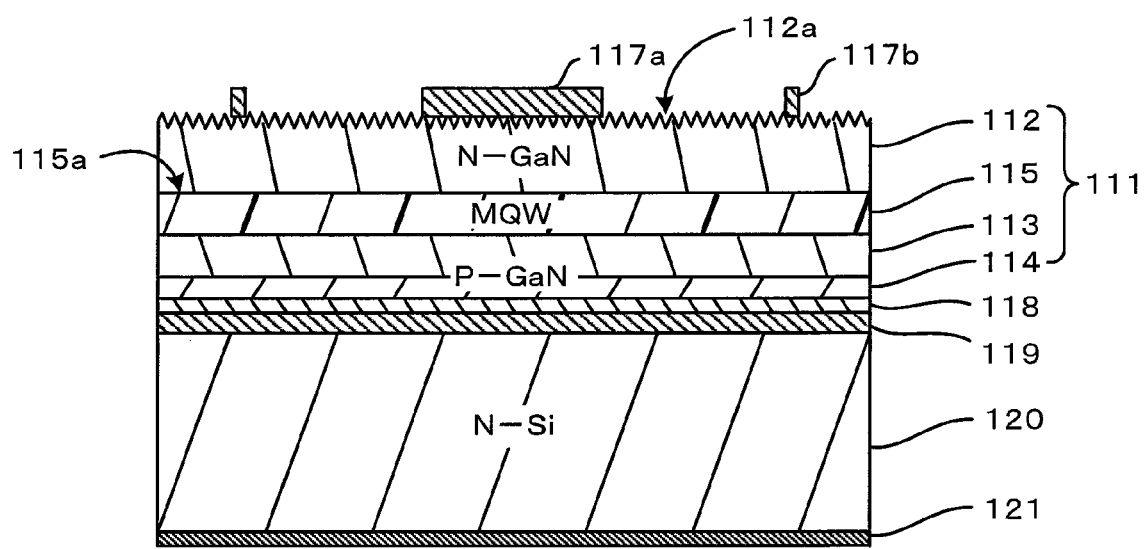

A semiconductor light emitting device in accordance with a second embodiment will be described with reference to FIGS. 12A and 12B. FIGS. 12A and 12B are views showing the semiconductor light emitting device in accordance with the second embodiment. FIG. 12A is a plan view. FIG. 12B is a sectional view taken along the line A-A in FIG. 12A. The semiconductor light emitting device of this embodiment is a blue LED (Light emitting Diode) using an InGaN-series nitride semiconductor.

As shown in FIGS. 12A and 12B, a semiconductor light emitting device 110 of this embodiment has a semiconductor lamination body 111. The semiconductor lamination body 111 includes an N-type GaN clad layer 112 as an N-type semiconductor layer; a P-type GaN clad layer 113 and a P-type GaN contact layer 114 as a P-type semiconductor layer; and a semiconductor light emitting layer 115 formed between the N-type GaN clad layer 112 and the P-type GaN clad layer 113.

The N-type GaN clad layer 112 has a concave-convex portion 112a on the upper surface on the opposite side of the semiconductor light emitting layer 115. Light having entered the concave-convex portion 112a from the semiconductor light emitting layer 115 is scattered or refracted to be extracted from the upper surface of the N-type GaN clad layer 112. The concave-convex portion 112a enhances the efficiency of the light extraction from the upper surface of the N-type GaN clad layer 112.

A pad electrode 117a for wire bonding is formed in the center of the N-type GaN clad layer 112. A line frame and a thin wire electrode 117b are formed on the N-type GaN clad layer 112. The line frame runs along the outer periphery of the N-type GaN clad layer 112. The thin wire electrode 117b is formed in an X-shaped line such that the thin wire electrode 117b extends from the pad electrode 117a in the four diagonal directions and is in contact with the four corners of the line frame.

The thin wire electrode 117b can spread current to the periphery of the semiconductor lamination body 111. The thin wire electrode 117b is formed as being a 2 μm-wide Au film, for example. Preferably, the thin wire electrode 117b is narrow in width because the thin wire electrode 117b blocks light from the semiconductor light emitting layer 115.

The metal electrode 118 is formed in contact with the P-type GaN contact layer 114 such that the metal electrode 118 is sandwiched between the P-type GaN contact layer 114 and a bonding layer 119. The metal electrode 118 is formed on the substantially entire surface of the P-type GaN contact layer 114. The metal electrode 118 is a doublelayer film of silver (Ag) and gold (Au) both allowing ohmic contact with the P-type GaN layer 114. Ag has high light reflectance to efficiently reflect incident light from the semiconductor light emitting layer 115.

A semiconductor lamination body 111 is formed on the metal electrode 118 so that both the metal electrode 118 and the bonding layer 119 are sandwiched between the semiconductor lamination body 111 and the support substrate 120. The bonding layer 119 includes a gold-tin (AuSn) alloy layer. The support substrate 120 includes a silicon substrate.

The substrate electrode 121 is formed on the opposite side of the support substrate 120 from the semiconductor lamination body 111. The substrate electrode 121 includes an Au film allowing ohmic contact with silicon.

Figure 13:
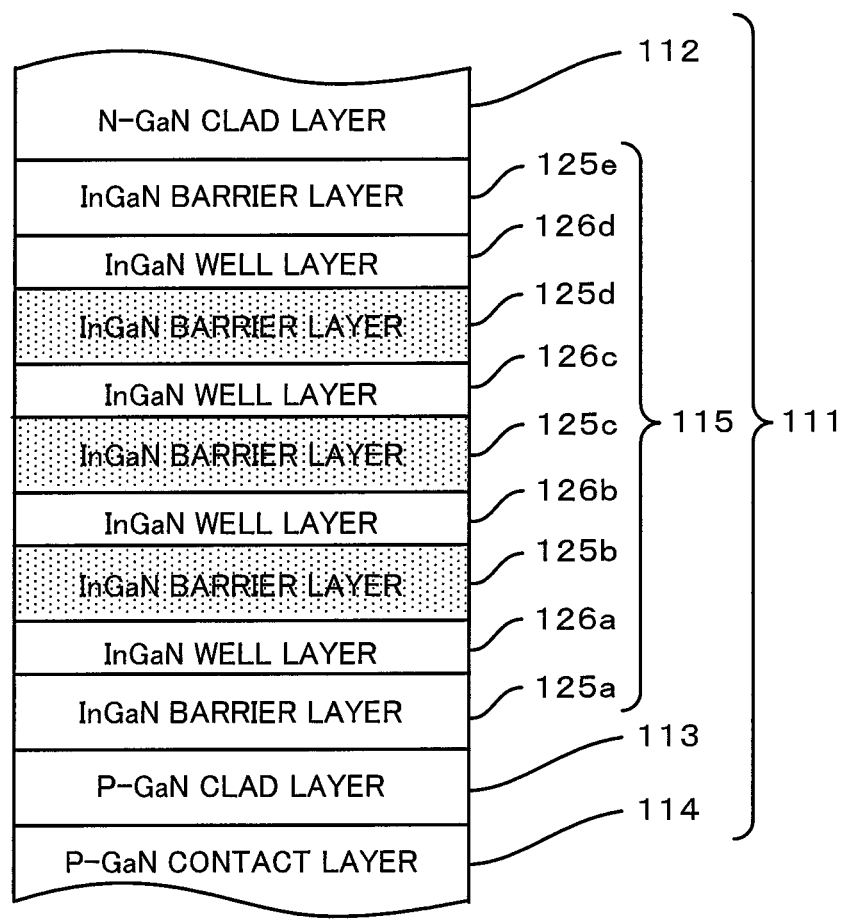
FIG. 13 is a cross-sectional view illustrating the main portion of the semiconductor light emitting device according to the second embodiment.

As shown in FIG. 13, the semiconductor light emitting layer 115 has a quantum well structure where the $In_{x2}Ga_{(1-x2)}N$ barrier layers 125a, 125b, 125c, 125d, and the 125e; and $In_{x1}Ga_{(1-x1)}N$ well layers 126a, 126b, 126c, and 126d are each laminated alternately. Hereinafter, the $In_{x2}Ga_{(1-x2)}N$ barrier layers and the $In_{x1}Ga_{(1-x1)}N$ well layers will be referred to simply as InGaN barrier layers and InGaN well layers, respectively. The semiconductor light emitting layer 115 starts with the InGaN barrier layer 125a and ends with the InGaN barrier layer 125e.

The InGaN barrier layers 125a, 125b, 125c, 125d, and 125e will be collectively denoted by the InGaN barrier layers 125. The InGaN well layers 126a, 126b, 126c, and 126d will be collectively denoted by the InGaN well layers 126.

The InGaN barrier layer 125 is 5 nm in thickness, for example. The InGaN well layer 126 is 5 nm in thickness, for example. The InGaN well layer 126 includes 4 layers.

The In-composition (x1) of the InGaN well layers 126 is set to about 0.15 so that light with a wavelength of 450 nm is emitted from the semiconductor light emitting device 110.

The In-composition (x1) of the InGaN well layer 126 and the In-composition (x2) of the InGaN barrier layer 125 satisfy a relation of $0 \leq x2 < x1 < 1$. The InGaN barrier layer 125 is adjusted such that the InGaN barrier layer 125 has a wider band gap than the InGaN well layer 126.

The InGaN barrier layer 125b of the barrier layers 125b, 125c, and 125d each sandwiched between the InGaN well layers is adjusted such that the InGaN barrier layer 125b nearest to the P-type GaN clad layer 13 has a narrower band gap than the InGaN barrier layers 125c and 125d.

Except for the InGaN barrier layer 125b, the InGaN barrier layers 125 are adjusted such that the InGaN barrier layers 125 on the side of the N-type GaN clad layer 112 have a band gap equal to or wider than that of the InGaN barrier layer 125 on the side of the P-type GaN clad layer 113.

When the band gap of the InGaN barrier layers 125 are denoted by Eg(125), more specifically, Eg(125a), et al, the following relation is established:

$$Eg(125b) < Eg(125c) \leq Eg(125d) \leq Eg(125a) = Eg(125e).$$

Figure 14:
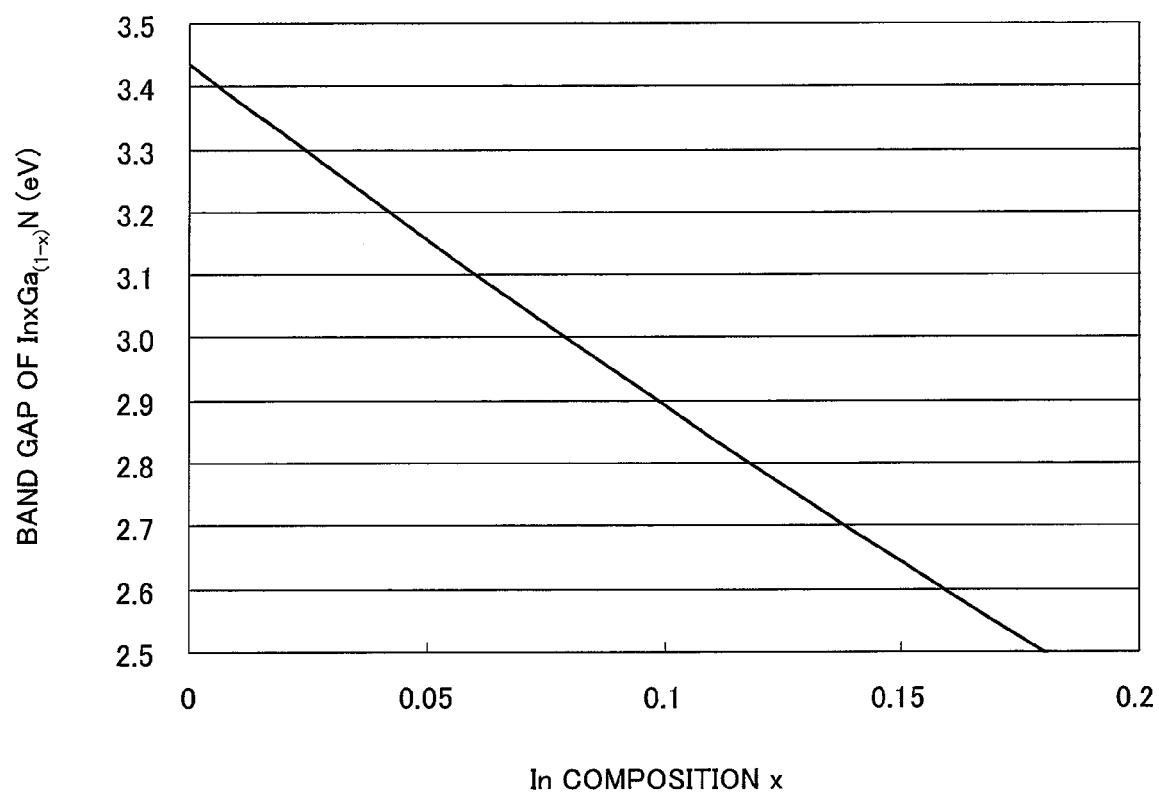
FIG. 14 is a graph illustrating a relation between a composition and a band gap of the main portion of the semiconductor light emitting device according to the second embodiment.

FIG. 14 is a view showing a relation of the In-composition x of the $In_xGa_{(1-x)}N$ layer versus the band gap Eg thereof. As shown in FIG. 14, the band gap Eg of the $In_xGa_{(1-x)}N$ layer changes from the band gap (about 3.45 eV) of GaN to the band gap (about 0.7 eV) of InN with changing the In-composition x. The change of the band gap is not linear and slightly convex downward owing to band gap bowing. Eg is about 2.64 eV at x=0.15.

The N-type GaN clad layer 112 has a thickness of 2 to 5 μm and an impurity concentration of $1 \times 10^{19}$ cm$^{-3}$, for example. The N-type GaN clad layer 112 serves as a single crystal buffer layer for growing epitaxially the layers from the semiconductor light emitting layer 115 to the P-type GaN contact layer 114.

The P-type GaN clad layer 113 has a thickness of 100 nm and an impurity concentration of $1 \times 10^{20}$ cm$^{-3}$, for example. The P-type GaN clad layer 114 has a thickness of 10 nm and an impurity concentration of $1 \times 10^{21}$ cm$^{-3}$, for example.

Applying a voltage between the pad electrode 117a and the substrate electrode 121 passes a current through the semiconductor light emitting layer 115 in a direction substantially vertical to the main surface 115a. Holes and electrons both having been injected into the InGaN well layer 126 radiatively recombine with each other so that light with a wavelength of about 450 nm is emitted.

The above-described semiconductor light emitting device 110 is adjusted such that the band gap of the InGaN barrier layer 125b is narrower than those of the InGaN barrier layers 125c and 125d. This prevents excessively high carrier density in the InGaN well layer 126a when a large current is passed therethrough.

Simulations will be described of the light output of the semiconductor light emitting device 110 and of the light output of semiconductor light emitting devices of first to second comparative examples, with reference to FIGS. 15 and 16.

Figure 15:
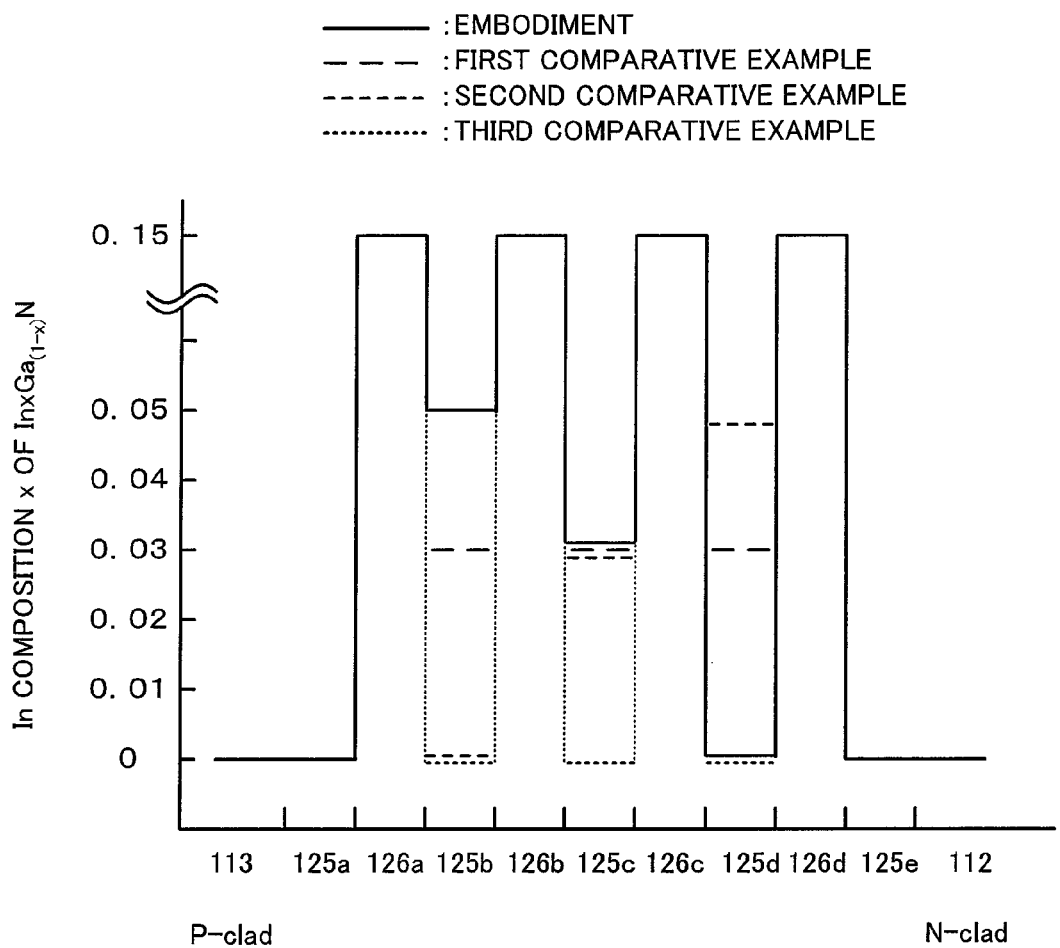
FIG. 15 is a view illustrating a composition distribution of the main portion of the semiconductor light emitting device according to the second embodiment.

FIG. 15 is a view showing In-composition distribution of the semiconductor light emitting layers 115 included in the semiconductor light emitting device 110 and the semiconductor light emitting devices of the first to third comparative examples. The In-compositions of the InGaN barrier layers 125a and 125e being each in contact with the P-type clad layer 113 and the N-type clad layer 112 are assumed to be zero. That is, the InGaN barrier layers 125a and 125e are simply GaN layers.

As shown in FIG. 15, in the semiconductor light emitting device 110 of this embodiment, the In-compositions x1 of the InGaN barrier layers 125b, 125c, and 125d are 0.05, 0.03, and 0, respectively. That is, the band gaps of the InGaN barrier layers 125b, 125c, and 125d become wider in order in the direction from the P-type clad layer 113 toward the N-type clad layer 112, satisfying the following formula:

$$Eg(125b)<Eg(125c)<Eg(125d)=Eg(125a)=Eg(125e)$$

Meanwhile, in the semiconductor light emitting device of the first comparative example, the In compositions x1 of the InGaN barrier layers 125b and 125c and 125d are 0.03, 0.03, and 0.03, respectively. That is, the band gaps of the InGaN barrier layers 125b, 125c, and 125d are equal to each other, satisfying the following formula:

$$Eg(125b)=Eg(125c)=Eg(125d)<Eg(125a)=Eg(125e).$$

In the semiconductor light emitting device of the second comparative example, the In-compositions x1 of the InGaN barrier layers 125b, 125c, and 125d are 0, 0.03, and 0.05, respectively. That is, the band gaps of the InGaN barrier layers 125b, 125c, and 125d become narrower in order in the direction from the P-type clad layer 113 toward the N-type clad layer 112, satisfying the following formula:

$$Eg(125d)<Eg(125c)<Eg(125b)<Eg(125a)=Eg(125e).$$

In the semiconductor light emitting device of the third comparative example, the In-compositions x1 of the InGaN barrier layers 125b, 125c, and 125d are 0, 0, and 0, respectively. That is, the band gaps of the InGaN barrier layers 125b, 125c, and 125d are equal to each other, satisfying the following formula:

$$Eg(125b)=Eg(125c)=Eg(125d)=Eg(125a)=Eg(125e).$$

The third comparative example has an In-concentration distribution mostly used in the background art.

Figure 16:
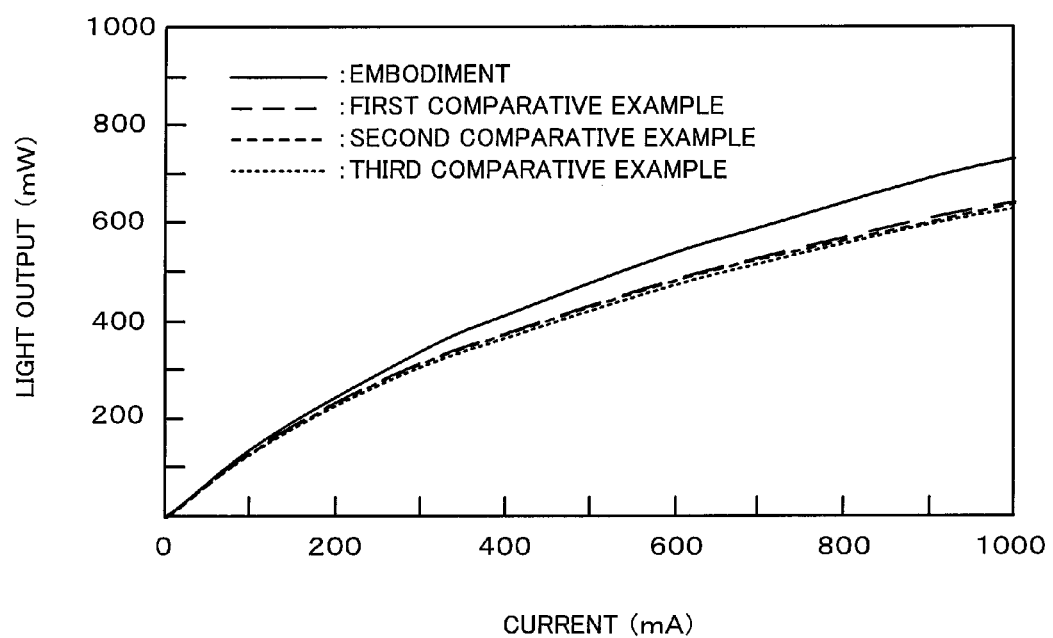
FIG. 16 is a graph illustrating light output characteristics of the semiconductor light emitting device in comparison with light output characteristics of a semiconductor light emitting device of a comparative example according to the second embodiment.

FIG. 16 is a view showing a simulation of the relations between current and light output in the semiconductor light emitting device 110 and the semiconductor light emitting devices of the first to third comparative examples. Both the InGaN barrier layer 125 and the InGaN well layer 126 are assumed to be 5 nm in thickness.

As shown in FIG. 16, the semiconductor light emitting device 110 of this embodiment has higher light output than the semiconductor light emitting device of the third comparative example. Meanwhile, the semiconductor light emitting devices of the first and second comparative examples have light output slightly higher than the output of the semiconductor light emitting device of the third comparative example.

Figure 17A:
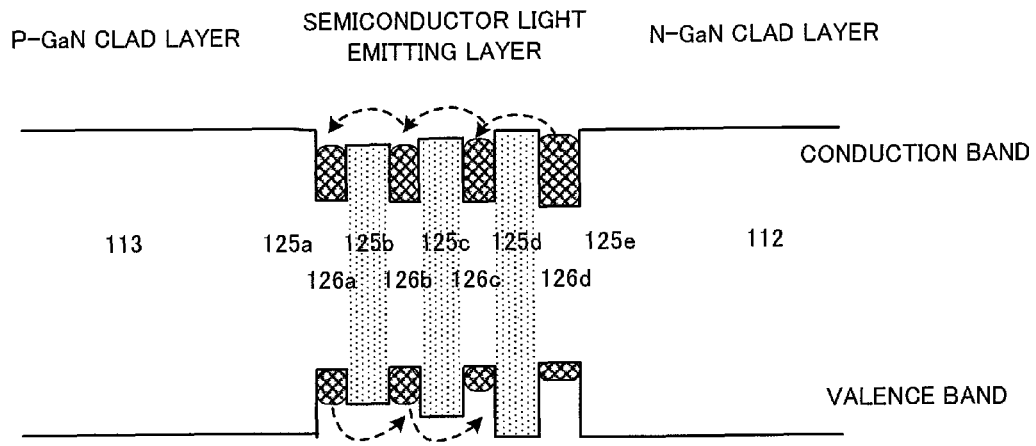
FIGS. 17A and 17B are views illustrating the band structure of the semiconductor light emitting device in comparison with the band structure of the semiconductor light emitting device of the comparative example according to the second embodiment.
Figure 17B:
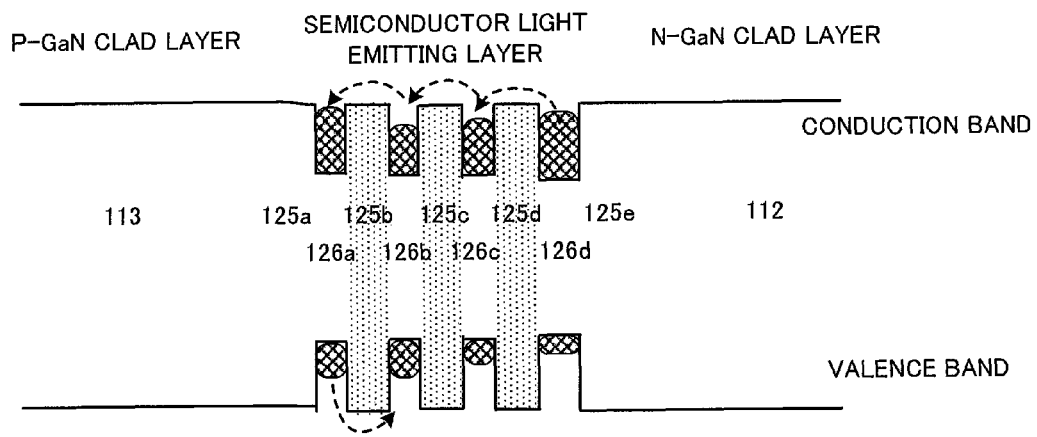

FIGS. 17A and 17B are views showing that carriers are injected into the InGaN well layers 126, being of this embodiment and the third comparative example, respectively. The third comparative example will be described below.

As shown in FIG. 17B, in the semiconductor light emitting device of the third comparative example, holes and electrons are injected from the sides of the P-type GaN clad layer 113 and the N-type GaN clad layer 112, respectively, into the semiconductor light emitting layer 115 including the MQW structure.

Heavy holes stay in the semiconductor light emitting layer 115 on the side of the P-type GaN clad layer 113 whereas light electrons reach the semiconductor light emitting layer 115 on the side of the P-type GaN clad layer 113. As a result, the holes and the electrons are more likely to recombine with each other in the InGaN well layer 126a on the side of the P-type GaN clad layer 113.

Holes and electrons concentrate in the InGaN well layer 126a. The InGaN well layer 126a is so thin that the density of carriers is excessively high therein. As a result, the non-radiative Auger recombination proportional to the cube of carrier density exceeds the radiative recombination proportional to the square of carrier density, thereby preventing high luminance efficiency.

Meanwhile, as shown in FIG. 17A, holes injected into the InGaN well layer 126a further go into the InGaN well layer 126b and 126c so that the hole density is equalized in the semiconductor light emitting device 110 of this embodiment.

As a result, the light output increases from the InGaN well layer 126a probably because the non-radiative Auger recombination decreases and the ratio of the radiative recombination (natural emission) to the Auger recombination increase.

The InGaN well layers 126b and 126c basically have low hole-density, thereby resulting in less Auger recombination and less radiative recombination (natural emission). The hole density increases in the InGaN well layers 126b and 126c to some degree to probably enhance the radiative recombination (natural emission) and the resultant light output.

The semiconductor light emitting devices of the first and second comparative examples have no obvious tendency that holes easily move from the InGaN well layer 126a to the InGaN well layers 126b and 126c. The above-described shows that the semiconductor light emitting devices of the first and second comparative examples have light output similar to that of the semiconductor light emitting device of the third comparative example.

As described above, in order to increase the light output of the semiconductor light emitting device, it essential to make the bandgap of the InGaN barrier layer 125b narrower than those of the InGaN barrier layers 125c and 125d.

Next, a method of manufacturing the semiconductor light emitting device 110 will be explained with reference to FIGS. 18A to 20. FIGS. 18A to 20 are cross-sectional views illustrating the steps of manufacturing the semiconductor light emitting device 110 in sequential order.

Figure 18A:
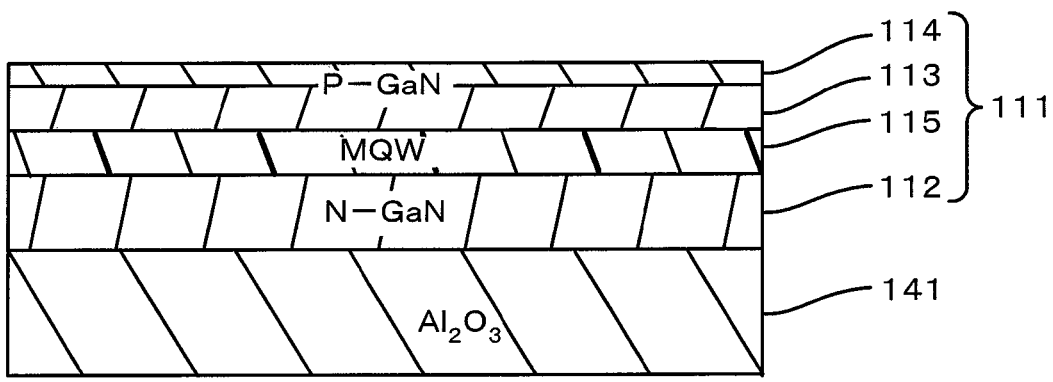
FIGS. 18A to 20 are cross-sectional views illustrating the steps of manufacturing the semiconductor light emitting device in sequential order according to the second embodiment.

As shown in FIG. 18A, the N-type GaN clad layer 112, the light emitting layer 115, the P-type GaN clad layer 113 and the P-type GaN contact layer 114 are epitaxially grown on a sapphire substrate 141 with a C plane of a plane direction for epitaxial growth in the order by MOCVD (metal organic chemical vapor deposition) method so as to form the semiconductor laminated body 111.

The process of forming the semiconductor laminated body 11 is briefly described below. As a preliminary treatment, a sapphire substrate 141 is subjected to organic cleaning and acid cleaning, for example. The resultant sapphire substrate 141 is contained in a reaction chamber of the MOCVD system. Thereafter, the temperature of the sapphire substrate 141 is raised to 1100° C., for example, by high-frequency heating in a normal-pressure atmosphere of a mixed gas of a nitrogen ($N_2$) gas and a hydrogen ($H_2$) gas. Thereby, the surface of the sapphire substrate 141 is etched in gas phase, and a natural oxide film formed on the surface of the sapphire substrate 141 is removed.

The N-type GaN layer 112 with a thickness of 4 μm, in which the silicon concentration is 1 E19 $cm^{-3}$, is formed by using the mixed gas of the $N_2$ gas and the $H_2$ gas as a carrier gas while supplying an ammonium ($NH_3$) gas and a trimethyl gallium (TMG) gas, for example, as process gases, and supplying a silane ($SiH_4$) gas, for example, as the N-type dopant.

The temperature of the sapphire substrate 141 is decreased to and kept at 800° C. which is lower than 1100° C., for example, while continuing supplying the $NH_3$ gas with the supply of the TMG gas and the $SiH_4$ gas stopped.

The InGaN barrier layer 125e with a thickness of 5 nm, in which the In composition ratio is 0, the InGaN well layer 126d with a thickness of 5 nm, in which the In composition ratio is 0.15, the InGaN barrier layer 125d with a thickness of 5 nm, in which the In composition ratio is 0, and the InGaN well layer 126c with a thickness of 5 nm, in which the In composition ratio is 0.15, are formed by using the $N_2$ gas as the carrier gas while supplying the $NH_3$ gas and the TMG gas as the process gases, and intermitting the supply of a trimethyl indium (TMI) gas, for example.

The InGaN barrier layer 125c with a thickness of 5 nm, in which the In composition ratio is 0.03, the InGaN well layer 126b with a thickness of 5 nm, in which the In composition ratio is 0.15, the InGaN barrier layer 125b with a thickness of 5 nm, in which the In composition ratio is 0.05, and the InGaN well layer 126a with a thickness of 5 nm, in which the In composition ratio is 0.15, are formed while supplying the $NH_3$ gas and the TMG gas as the process gases, and increasing or decreasing the supply of the TMI gas.

Finally, the InGaN barrier layer 125a with a thickness of 5 nm, in which the In composition ratio is 0, is formed while stopping supplying only the TMI gas. Thereby, the light emitting layer 115 having the MQW structure is obtained.

The P-type GaN clad layer 113 with a thickness of 100 nm, in which the concentration of Mg is approximately 1 E20 $cm^{-3}$, is formed. The P-type GaN contact layer 114 with a thickness of approximately 10 nm, in which the concentration of Mg is approximately 1 E21 $cm^{-3}$, is formed.

Figure 18B:
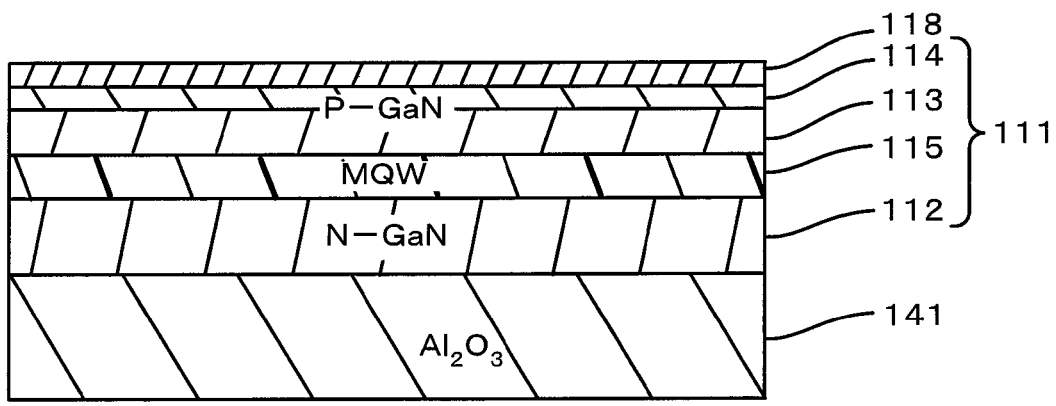

As shown in FIG. 18B, a silver film with a thickness of 0.5 μm and the gold film with a thickness of 1 μm are stacked on the P-type GaN contact layer 114 by sputtering method so as to form the metal electrode 118.

Figure 18C:
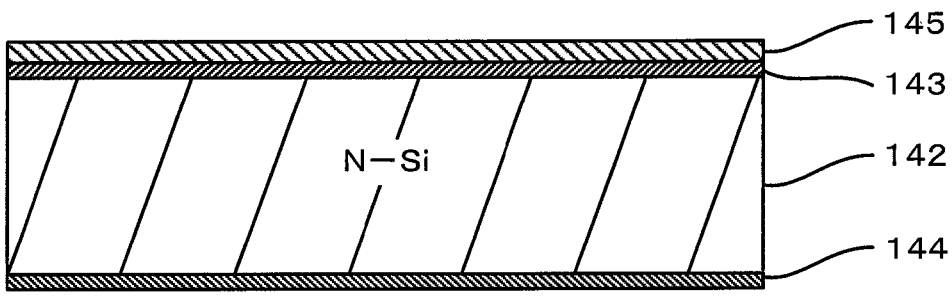

As shown in FIG. 18C, a silicon substrate 142 is prepared. Gold films 143, 144 with a thickness of 1 μm are formed on the both side surfaces of the silicon substrate 52 by sputtering method, for example. A gold tin (AuSn) alloy film 145 is formed on the gold film 143 by vacuum evaporation method, for example. The silicon substrate 142 is the support substrate 120. The gold film 144 is the substrate electrode 121.

Figure 19A:
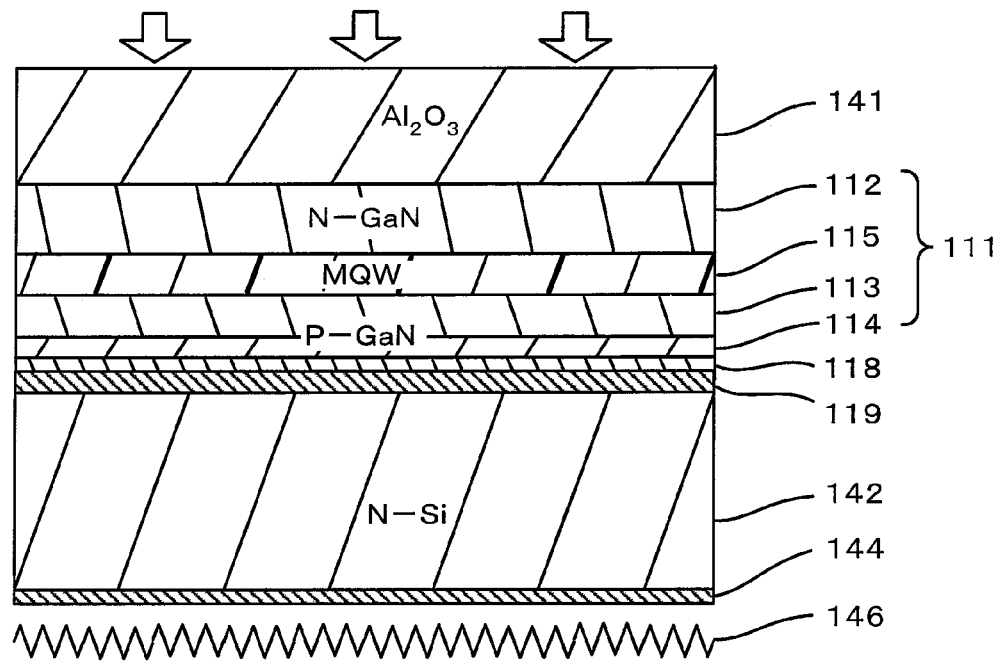

As shown in FIG. 19A, the sapphire substrate 141 is reversed upside down, so that the metal electrode 118 faces the gold tin alloy film 145, and the sapphire substrate 141 and the silicon substrate 142 are placed on each other. Thereafter, the sapphire substrate 141 and the silicon substrate 142 are heated by a heater 146 and pressed.

Since the gold tin alloy film 145 is melted, the gold film of the metal electrode 118 and the gold film 143 are fused, so that the bonding layer 119 is formed. The sapphire substrate 141 and the silicon substrate 142 are bonded with the bonding layer 119 interposed in between.

Figure 19B:
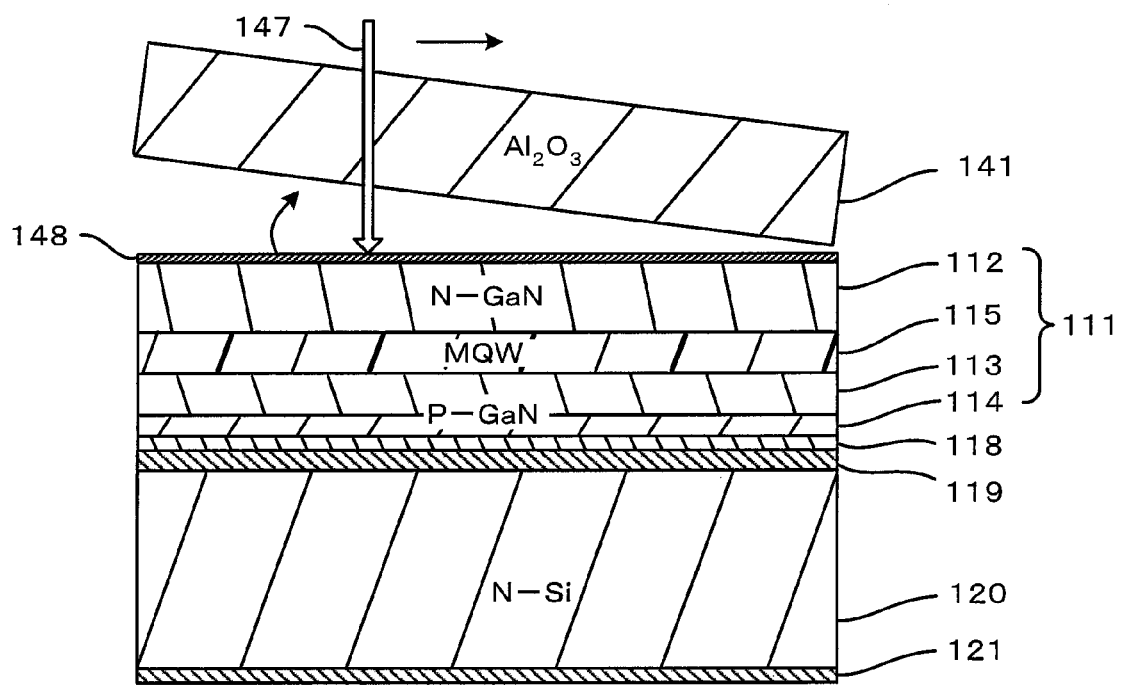

As shown in FIG. 19B, the sapphire substrate 141 and the semiconductor laminated body 111 are separated, by laser lift-off method. The laser lift-off method is a method for emitting high-output laser beam to partially decompose inside of a substance by heat application and separating the substance with the decomposed portion being the border.

A gold film is formed on the N-type GaN clad layer 112 with the concave-convex portion 112a by sputtering method, for example. The gold film is patterned so as to form the pad electrode 117a and the thin wire electrode 117b. Thereby, the light emitting device 110 shown in FIGS. 12A and 12B is obtained.

An X-ray diffraction method, etc. can evaluate the InGaN barrier layer 125 and the InGaN well layer 126 for the In-compositions x2 and x1, respectively.

Specifically, the lattice constant of the InGaN barrier layers 125 is determined using the X-ray diffraction method, thereby determining the In-composition x2. A relation between the In-composition and lattice constant of InGaN obeys a Vegard's law. GaN has an a-axis length of about 0.319 nm and a c-axis length of about 0.518 nm. InGaN has an a-axis length of about 0.355 nm and a c-axis length of about 0.576 nm.

As described above, the semiconductor light emitting layer 115 has the multiple quantum-well structure where the InGaN well layers 126 and the InGaN barrier layers 125 are each laminated alternately. In addition, the InGaN barrier layer 125b nearest to the P-type GaN clad layer 113 among the InGaN barrier layers 125 sandwiched with InGaN well layers 126 has a narrower band gap than the InGaN barrier layers 125c and 125d.

The thin wire electrode 117b and the metal electrode 118 are formed to pass a current through the semiconductor light emitting layer 115 in a direction substantially vertical to the main surface thereof.

As a result, holes injected into the InGaN well layer 126a can get over the low barrier of the InGaN barrier layer 125b to go into the InGaN well layers 126b and 126c, thereby averaging the hole density in the InGaN well layers 126.

The carrier density in the InGaN well layer 126a is properly maintained also during the great-current driving, thereby allowing it to prevent the Auger recombination and the carrier overflow. Thus, the semiconductor light emitting device with high light output is achieved.

Figure 21:
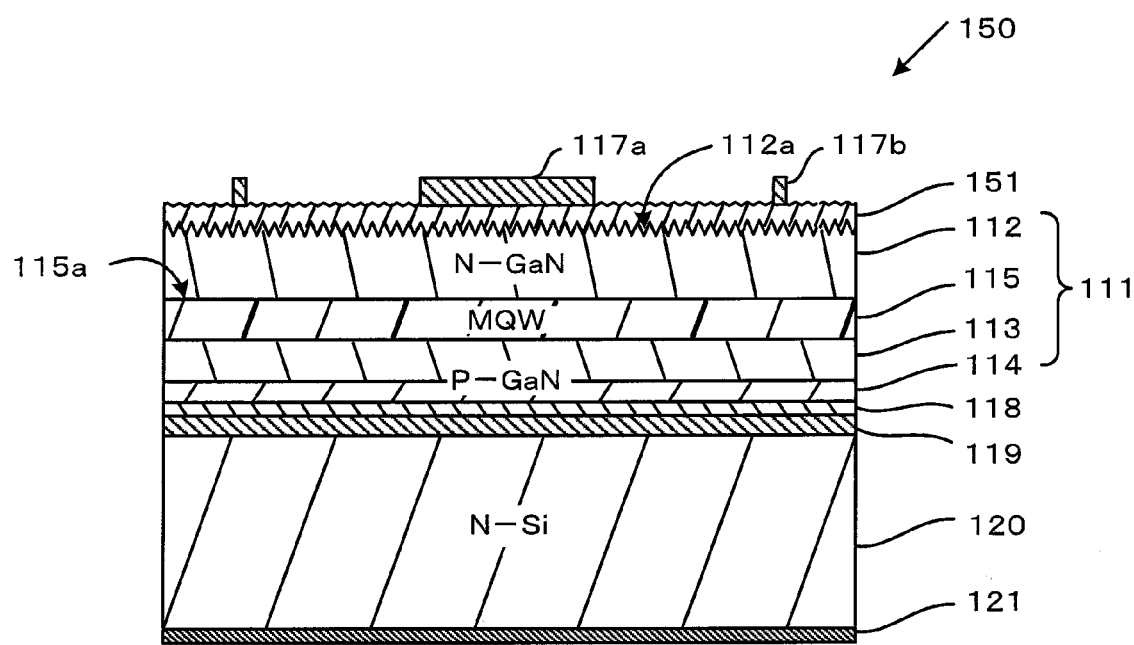
FIGS. 21 to 23 are cross-sectional views illustrating another semiconductor light emitting device according to the second embodiment.

The semiconductor light emitting device 110 may include a transparent conductive film for enhancing the spread of current. FIG. 21 is a sectional view showing a semiconductor light emitting device including the transparent conductive film on the N-type GaN clad layer 112.

As shown in FIG. 21, in the semiconductor light emitting device 150, the transparent conductive film (the first electrode) 151 is formed on the substantially entire surface of the concave-convex portion 112a of the N-type GaN clad layer 112. The transparent conductive film 151 is transparent to light emitted from the light emitting layer 115. The transparent conductive film 151 includes an ITO (Indium Tin Oxide) film having a thickness of 100 to 200 nm.

The pad electrode 117a and the thin wire electrode 117b are formed on the transparent conductive film 151. Spreading the current certainly to the periphery of the semiconductor lamination body 111 only by the use of the thin wire electrode 117b requires a large square of the thin wire electrode 117b. The large square of the thin wire electrode 117b blocks light to some degree to cause a problem that the light output reduces.

Forming the thin wire electrode 117b and the transparent conductive film 151 as being a stem; and branches and leaves, respectively, allows it to spread current certainly to the periphery of the semiconductor lamination body 111 and drastically reduce the light blocking of the thin wire electrode 117b.

The sheet resistance of the transparent conductive film 151 is much higher than that of the thin wire electrode 117b, which spreads current firstly to the thin wire electrode 117b and secondly to the transparent conductive film 151.

The N-type GaN clad layer 112 has higher resistivity than transparent conductive films including an ITO film. Accordingly, the thickly grown N-type GaN clad layer 112 has sheet resistance one order of magnitude higher than the ITO film. The current spreads mostly through the transparent conductive film 151 and partially through the N-type GaN clad layer 112.

Figure 22:
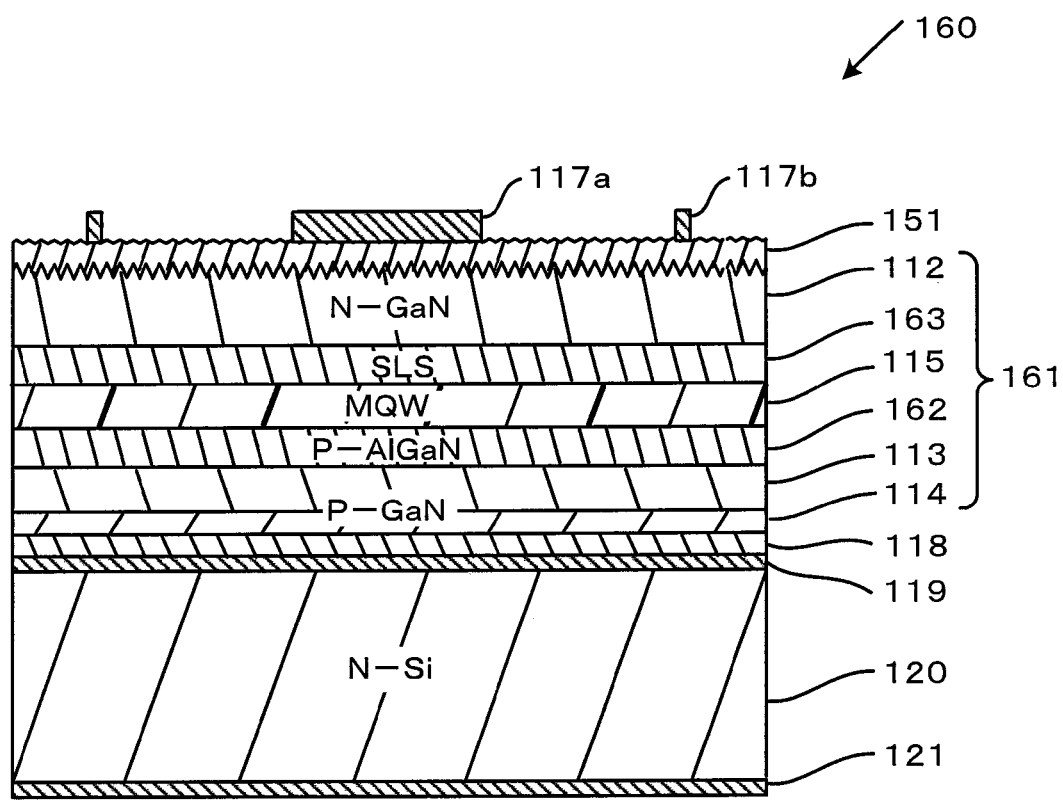

The semiconductor light emitting device 110 can be further provided with an overflow prevention layer for preventing the carrier overflow. A superlattice buffer layer can be further formed for enhancing the crystallinity of the semiconductor lamination body 115. FIG. 22 is a sectional view showing a semiconductor light emitting device including the overflow prevention layer and the superlattice buffer layer.

As shown in FIG. 22, the semiconductor lamination body 161 of the semiconductor light emitting device 160 includes the P-type AlGaN overflow prevention layer 162 between the semiconductor light emitting layer 115 and the P-type GaN clad layer 113.

The P-type AlGaN overflow prevention layer 162 has a thickness of 5 nm, a Mg-concentration of $1\times10^{20}$ cm$^{-3}$, and an Al-composition ratio of 0.2. The P-type AlGaN overflow prevention layer 62 has a wider band gap than the P-type GaN clad layer 113.

The superlattice buffer layer 163 is formed between the semiconductor light emitting layer 115 and the N-type GaN clad layer 112. The first and second InGaN layers, which differ from each other in an In-composition, are each laminated alternately as being 30 pairs of the first and second InGaN layers, for example.

The first and second InGaN layers are 1 nm and 3 nm in thickness, respectively. The first InGaN layer has a higher In-composition than the second InGaN layer.

The P-type AlGaN overflow prevention layer 162 effectively prevents carriers in the InGaN well layer 126 from overflowing into the P-type GaN clad layer 113. The superlattice buffer layer 163 prevents lattice defects such as dislocations from propagating from the N-type GaN clad layer 112 to the semiconductor light emitting layer 115. As a result, the semiconductor light emitting device 160 advantageously increases its light output.

Figure 23:
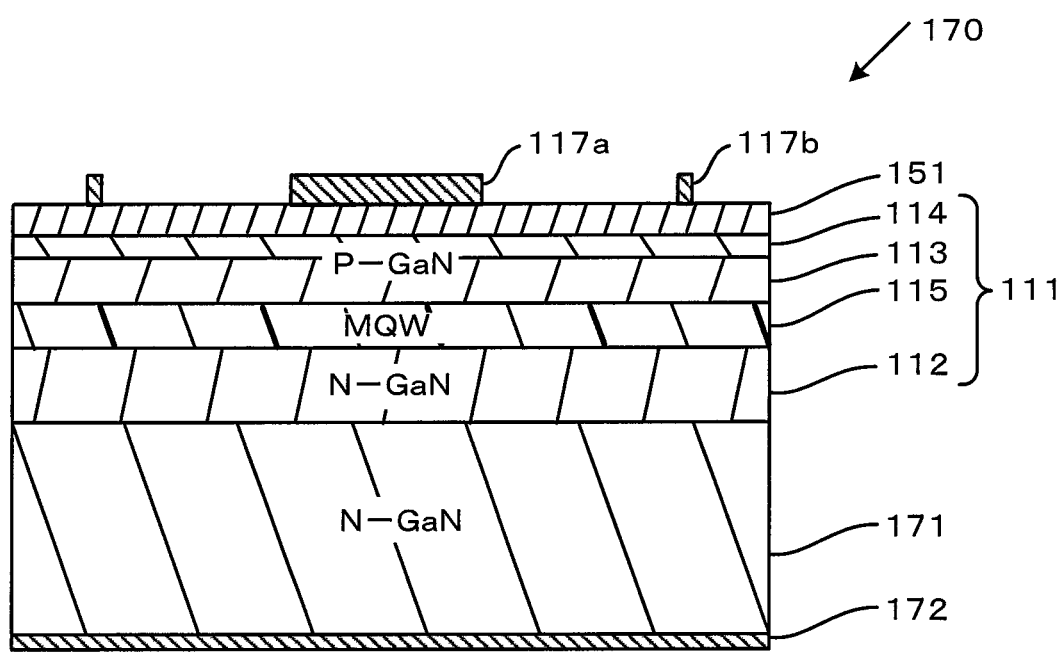

FIG. 23 is a sectional view showing a semiconductor light emitting device having a semiconductor lamination body formed on a conductive substrate. As shown in FIG. 23, the semiconductor lamination body 111 of the semiconductor light emitting device 170 is formed on the C surface of the conductive substrate 171 for growth, e.g., a C surface of a GaN substrate.

The N-type GaN clad layer 112, the semiconductor light emitting layer 115, the P-type GaN clad layer 113, and the P-type GaN contact layer 114 are formed on the conductive substrate 171 in order. The transparent conductive film 151 is formed on the P-type GaN contact layer 114.

The substrate electrode 172 is formed on the opposite side of the conductive substrate 171 from the N-type GaN clad layer 112. The substrate electrode 172 is a Ti/Pt/Au film allowing ohmic contact with the P-type GaN layer, for example.

In addition, a P-type nitride-series semiconductor is difficult to grow thick. Accordingly, the P-type nitride-series semiconductor film has higher resistivity than transparent conductive films including an ITO film. A current will spread mostly through the transparent conductive film 151. A negligibly small current spreads through the P-type GaN layers including the P-type GaN clad layer 113 and the P-type GaN contact layer 114.

Alternatively, a current-block layer may be formed on the P-type GaN contact layer 114 in the transparent conductive film 151 such that the current-block layer faces the pad electrode 117a and the thin wire electrode 117b and the current-block layer is not in contact with the pad electrode 117a and the thin wire electrode 117b.

Figure 24:
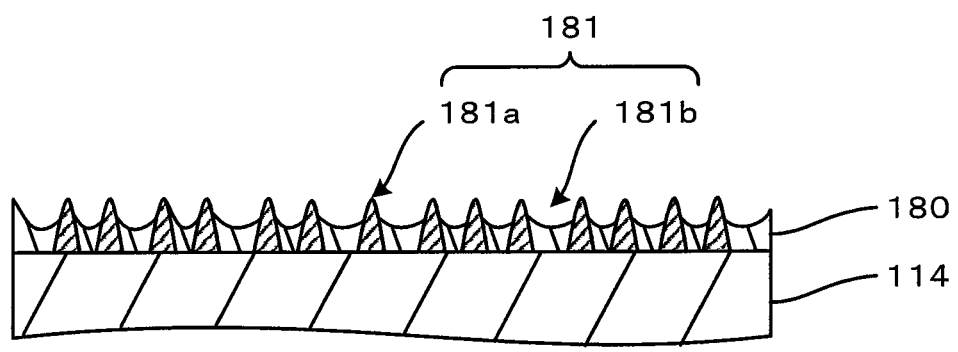
FIG. 24 is a cross-sectional view illustrating a main portion of another semiconductor light emitting device according to the second embodiment.

Furthermore, the transparent conductive film 151 may include a concave-convex portion to enhance its light-extraction efficiency. FIG. 24 is a sectional view showing the essential portion of a semiconductor light emitting device including the transparent conductive film having a concave-convex surface.

As shown in FIG. 24, the transparent conductive film 180 has the concave-convex surface 181 including the substantially crystalline convex 181a and the substantially amorphous concave 181b.

The In-compositions x of the InGaN barrier layers 125b, 125c, and 125d have been described as being 0.05, 0.03, and 0, respectively. The In-compositions x thereof are not limited to these values only if the In-compositions x become lower in this order.

Alternatively, the In-compositions x of the InGaN barrier layers 125b, 125c, and 125d may be 0.05, 0.02, and 0.01; or 0.06, 0.02, and 0. The In-compositions x can be properly adjusted for targeted light output.

Although the embodiments have been described assuming 4 InGaN well layers 126, the number of the InGaN well layers 126 is not limited to 4.

Third Embodiment

Figure 25:
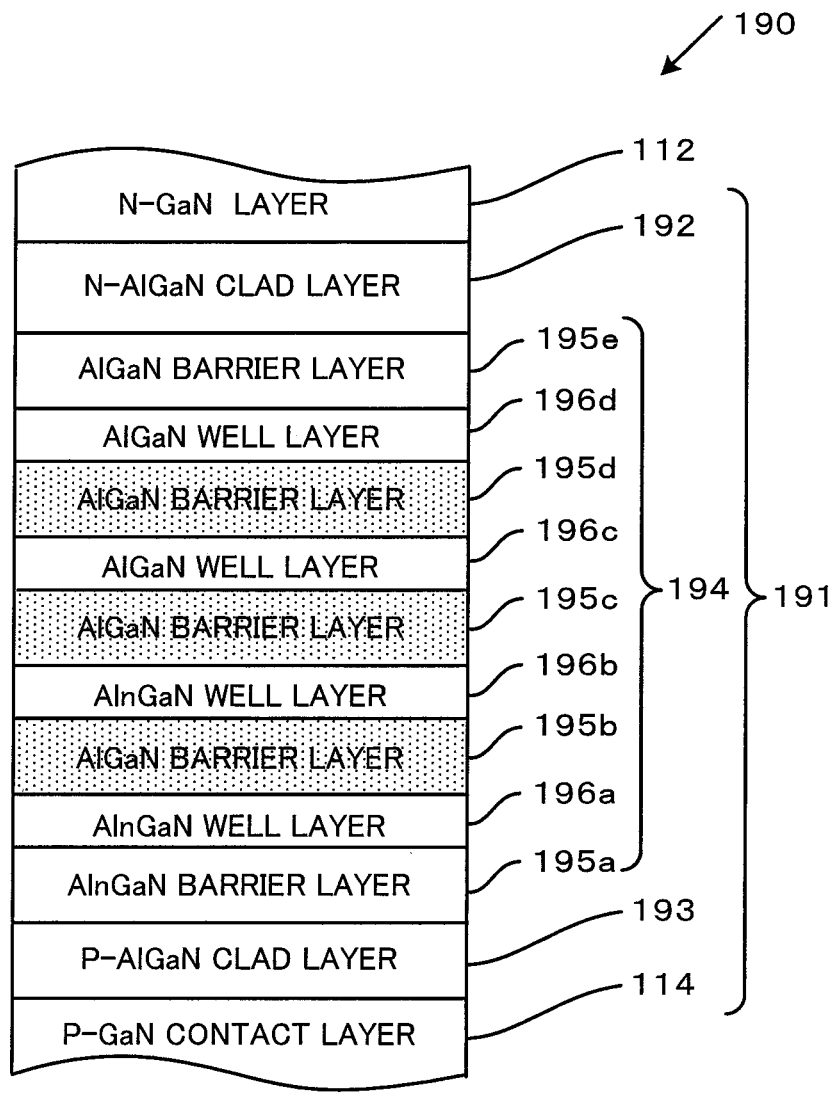
FIG. 25 is a cross-sectional view illustrating a main portion of a semiconductor light emitting device according to a third embodiment.
Figure 26:
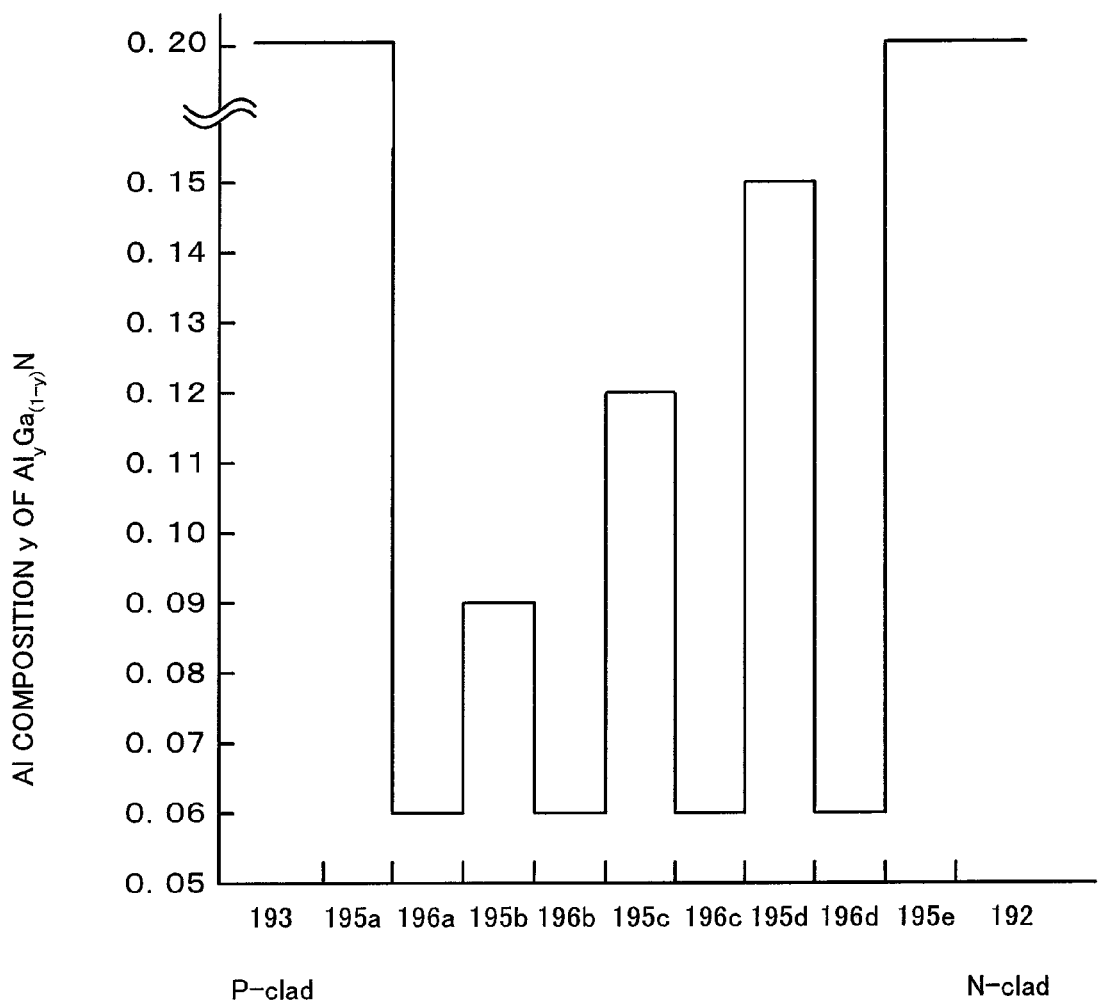
FIG. 26 is a view illustrating the composition distribution of the main portion of the semiconductor light emitting device according to the third embodiment.

A semiconductor light emitting device in accordance with a third embodiment will be described with reference to FIGS. 25 and 26. FIG. 25 is a sectional view showing the essential portion of the semiconductor light emitting device in accordance with the third embodiment. FIG. 26 is a view showing the composition distribution of the essential portion. Wherever possible, the same reference numerals will be used in the third embodiment to denote the same as those in the first embodiment. The same description will not be repeated. The third embodiment differs from the second embodiment in that the semiconductor light emitting layer is made up of an AlGaN layer.

As shown in FIG. 25, the N-type $Al_{y3}Ga_{(1-y3)}N$ clad layer 192 (hereinafter referred to as the N-type AlGaN clad layer) is formed in contact with the N-type GaN layer 112, i.e., single crystal underlayer, in the semiconductor lamination body 191 of the semiconductor light emitting device 190 of this embodiment. The P-type $Al_{y3}Ga_{(1-y3)}N$ clad layer 193 (hereinafter referred to as the P-type AlGaN clad layer) is formed in contact with the P-type GaN contact layer 114.

The semiconductor light emitting layer 194 is formed between the N-type AlGaN clad layer 192 and the P-type AlGaN clad layer 193, and has a quantum well structure where the $Al_{y2}Ga_{(1-y2)}N$ barrier layers 195a and 195b, 195c, 195d, and the 195e (hereinafter referred to as the AlGaN barrier layers) and the $Al_{y1}Ga_{(1-y1)}N$ well layers 196a, 196b, 196c, and 196d (hereinafter referred to as the AlGaN well layers) are each laminated alternately.

The semiconductor light emitting layer 194 starts from the AlGaN barrier layer 195a in contact with the P-type AlGaN clad layer 193, and ends at the AlGaN barrier layer 195e in contact with the N-type AlGaN clad layer 192.

The AlGaN barrier layers 195a, 195b, 195c, 195d, and 195e will be collectively denoted by the AlGaN barrier layers 195. The AlGaN well layers 196a, 196b, 196c, and 196d will be collectively denoted by the AlGaN well layers 196.

Each of the AlGaN barrier layers 195 is 5 nm in thickness, for example. Each of the AlGaN well layers 196 is 5 nm in thickness, for example. The number of the AlGaN well layers 196 is 4, for example.

The Al-composition y1 of the AlGaN well layers 196 is about 0.06 for the semiconductor light emitting device 190 to emit light having wavelengths of 360 to 380 nm.

The Al-composition y1 of the AlGaN well layers 196 and the Al-composition y2 of the AlGaN barrier layers 195 satisfy a relation of $0<y1<y2\leq 1$. The AlGaN barrier layers 195 are each adjusted to have a wider band gap than the AlGaN well layers 196.

Furthermore, the AlGaN barrier layer 195b nearest to the P-type AlGaN clad layer 193 is adjusted to have a narrower band gap than the AlGaN barrier layers 195c and 195d.

Except for the AlGaN barrier layer 195b, the AlGaN barrier layers 195 are adjusted such that the AlGaN barrier layers 195 on the side of the N-type AlGaN clad layer 192 has a band gap equal to or wider than that of the AlGaN barrier layer 195 on the side of the P-type AlGaN clad layer 193.

When the band gap of the AlGaN barrier layers 195 is denoted by Eg(195), more specifically, Eg(195a), et al, the following relation is established:

$$Eg(195b)<Eg(195c)<Eg(195d)<Eg(195a)=Eg(195e).$$

The band gap Eg of an $Al_yGa_{(1-y)}N$ layer changes from the band gap (about 3.45 eV) of GaN to the band gap (about 6.2 eV) of AlN depending on the Al-composition y. The change is not, however, linear and slightly convex downward owing to the band gap bowing.

FIG. 26 is a view showing the Al-composition distribution of the semiconductor light emitting layer 194. Both the Al-compositions y3 of the N-type AlGaN clad layer 192 and the P-type AlGaN clad layer 193 are controlled to be 0.2. Both the Al-compositions y2 of the AlGaN well layer 195e in contact with the AlGaN well layer 195a and the N-type AlGaN clad layer 192 in contact with the P-type AlGaN clad layer 193 are controlled to be 0.2.

As shown in FIG. 26, in the semiconductor light emitting device 190 of this embodiment, the Al compositions y1 of the AlGaN barrier layers 195b, 195c, and 195d are 0.09, 0.12, and 0.15, respectively. That is, the band gaps of the InGaN barrier layers 195b, 195c, and 195d become wider in order in the direction from the P-type clad layer 193 toward the N-type clad layer 192, satisfying the following formula:

$$Eg(195b)<Eg(195c)<Eg(195d)=Eg(195a)=Eg(195e).$$

Applying a voltage between the pad electrode 117a and the substrate electrode 121 causes a current to pass through the semiconductor light emitting layer 115 in a direction substantially perpendicular to the main surface 115a. Carriers injected into the AlGaN well layers 196 recombined with each other to emit near-ultraviolet light having wavelengths of 360 to 380 nm.

In the semiconductor light emitting device 190 mentioned above, the AlGaN barrier layer 195b is adjusted to have a narrower band gap than the AlGaN barrier layers 195a, 195c, 195d, and 195e so that the carrier density in the AlGaN well layer 196a is prevented from being excessively high when a large current is supplied.

The operation principle and manufacturing method of the semiconductor light emitting device 190 is the same as that of the semiconductor light emitting device 110 shown in FIGS. 12A and 12B. The same description will not be repeated.

As described above, the carrier density within the AlGaN well layers 196a is properly maintained also during great-current driving in the semiconductor light emitting device 190 of this embodiment, thereby allowing it to prevent the Auger recombination and the carrier overflow. Thus, the semiconductor light emitting device is obtained with high light output of near-ultraviolet light in the wavelength range from 380 to 200 nm.

Alternatively, the semiconductor light emitting device 190 may include the transparent conductive film 151, the P-type AlGaN overflow prevention layer 162 shown in FIG. 22, and the superlattice buffer layer 163. Alternatively, the semiconductor lamination body 191 may be formed on the conductive substrate as shown in FIG. 23.

The Al-compositions y of the AlGaN barrier layers 195b, 195c, and 195d are not specifically limited only if the Al-compositions y become higher in this order. The number of the AlGaN well layers 196 is not specifically limited.

Fourth Embodiment

Figure 27A:
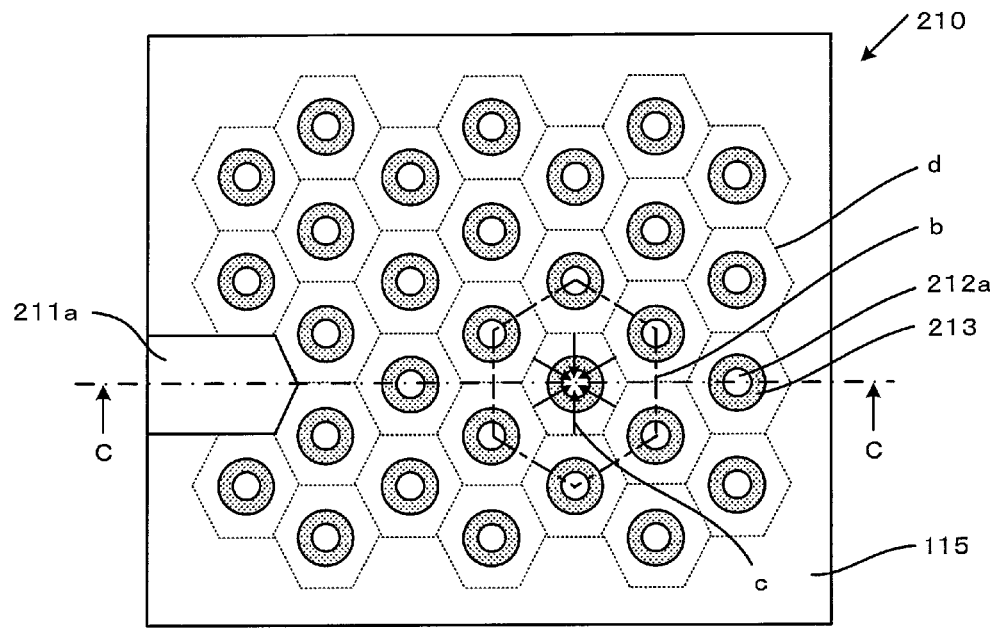
FIGS. 27A and 27B are views illustrating a semiconductor light emitting device according to a fourth embodiment.
Figure 27B:
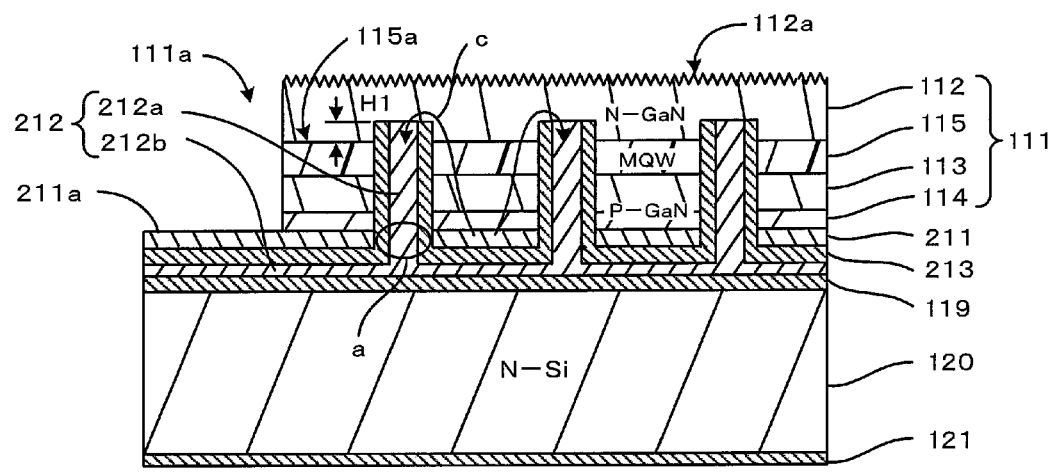

A semiconductor light emitting device in accordance with a fourth embodiment will be described with reference to FIGS. 27A and 27B. FIGS. 27A and 27B are views showing the semiconductor light emitting device of this embodiment. FIG. 27A is a plan view with the upper portion removed. FIG. 27B is a sectional view taken along the line C-C in FIG. 27A and viewed in the arrow-direction.

Wherever possible, the same reference numerals will be used in the third embodiment to denote the same as those in the second embodiment, and the same description will not be repeated. The fourth embodiment differs from the second embodiment in that the current passing through the semiconductor light emitting layer is extracted from the side of the P-type semiconductor layer.

As shown in FIGS. 27A and 27B, the semiconductor light emitting device 210 of this embodiment is configured in the same way as the semiconductor light emitting device 110 shown in FIG. 12 so that the P-side electrode 211 is formed on the P-type GaN contact layer 14.

The different point is that the N-side electrode 212 includes a plurality of portions a such that the distance between the portion a and the main surface 115a is substantially equal to the distance between the main surface 115a and the P-side electrode 211. The P-side electrode 211 is disposed to enclose the N-side electrode 212 therewith at the portion a. Moreover, the portion a can be referred to as a portion where the N-side electrode 212 intersects with a plane containing the P-side electrode 211.

That is, the N-side electrode 212 includes a plurality of columnar first N-side electrodes 212a that pass through the semiconductor light emitting layer 115 from the P-side electrode 211 and are in contact with the N-type GaN clad layer 112. The first N-side electrodes 212a are arranged at each apex and the central point of the hexagon b denoted by chain lines (honeycomb), for example. The first N-side electrode is a column that is 2 to 20 μm in diameter, for example. The distance between the first N-side electrodes adjacent to each other is 10 to 100 nm, for example.

The first N-side electrode 212a protrudes into the N-type GaN clad layer 112 just by a height of H1 from the interface between the semiconductor light emitting layer 115 and the N-type GaN clad layer 112. The side surface of the first N-side electrode 212a is covered with the insulating film 213. The first N-side electrode 212a is electrically separated from the layers from the P-side electrode 211 to the semiconductor light emitting layer 115.

Furthermore, the N-side electrode 212 is formed on the P-side electrode 211 through the insulating film 213, and has the second N-side electrode 212b to which two or more first N-side electrodes 212a are commonly connected. The insulating film 213 is a silicon oxide film having a thickness of 100 to 300 nm, which is formed with a CVD (Chemical Vapor Deposition) method.

The first N-side electrode 212a is formed to extract a current from the semiconductor light emitting layer 115 to the side of the P-type semiconductor layer. The second N-side electrode 212b is formed to collect currents extracted from the respective N-side electrodes 212a.

The semiconductor lamination body 111 is formed above the conductive support substrate 120 via the conductive bonding layer 119 sandwiched between the N-side electrode 212 and the conductive support substrate 120. The second N-side electrode 212b is in contact with the bonding layer 119. The semiconductor lamination body 111 includes the cutout 111a passing through the semiconductor lamination body 111. The P-side electrode 211 is partially exposed to the cutout 111a, and serves as the P-side electrode pad 211a.

The semiconductor light emitting device 210 of this embodiment is configured such that the semiconductor light emitting layer 115 homogenizes the number of holes injected from the P-side electrode 211 to equalize the hole density in the InGaN well layers 126 as well as the electron density therein by homogenizing the number of electrons injected from the N-side electrode 212.

Connecting the P-side electrode pad 211a and the substrate electrode 121 to the positive and negative terminals of a power supply, respectively, causes a current to flow from the P-side electrode 211 intensively to the first N-side electrode 212a as shown by the arrows c. The hexagonal shape "d" denoted by the dotted line shows a virtual area where the first N-side electrode 212a collects the current from the P-side electrode 211. As a result, the current distribution becomes more homogeneous in the plane of the semiconductor light emitting device 210.

The horizontal distance between the two the first N-side electrodes 212a adjacent to each other is 10 to 100 μm whereas the vertical distance between the P-type GaN contact layer 114 and the semiconductor light emitting layer 115 is 145 nm at longest. The horizontal distance is one to two orders of magnitude longer than the vertical distance.

Accordingly, the current is likely to flow more dominantly in the direction parallel to the main surface 115a of the semiconductor light emitting layer 115 than in the direction vertical thereto.

Increasing the current flowing in the direction vertical to the main surface 115a requires increasing the height H1 by which the first N-side electrode 212a protrudes into the N-type GaN clad layer 112. When the N-type GaN clad layer 112 is 4 μm in thickness, it is preferable that the height H1 is not less than 2 μm, for example.

This reduces the ratio between the horizontal distance and the vertical distance to a level of one order of magnitude. This also allows it to increase the current flowing in the direction vertical to the main surface 115a of the semiconductor light emitting layer 115.

Figure 28:
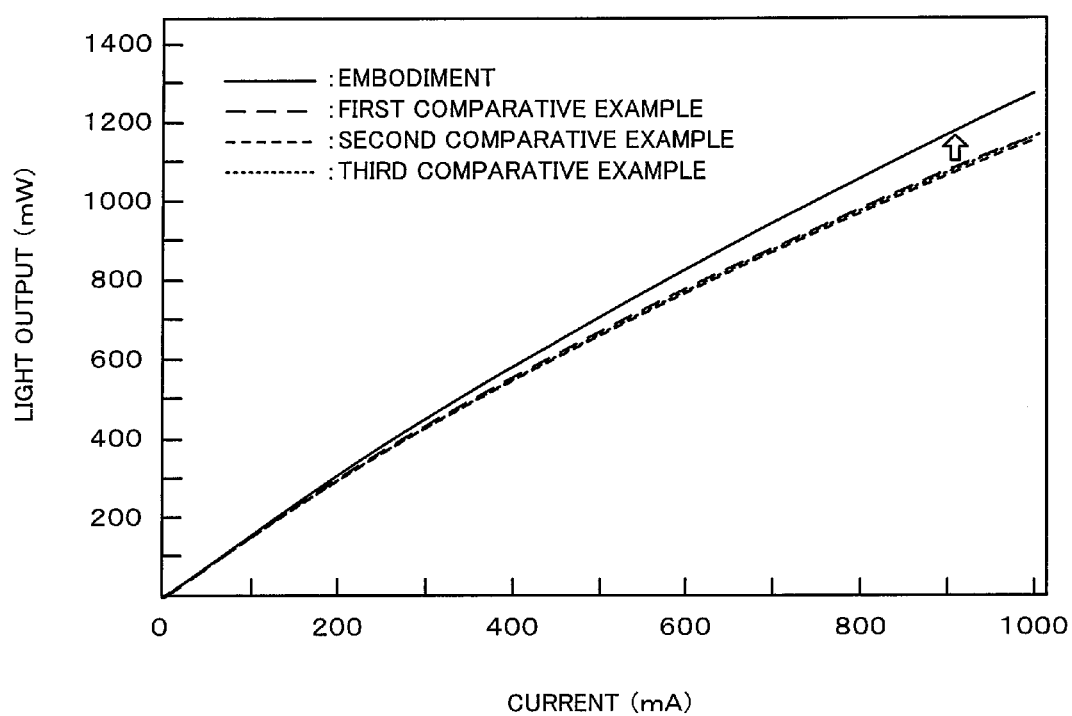
FIG. 28 is a graph illustrating a light output characteristics of the semiconductor light emitting device in comparison with light output characteristics of the semiconductor light emitting device of the comparative example according to the fourth embodiment.

A simulation of the light output of the semiconductor light emitting device 210 will be described below with reference to FIG. 28. In FIG. 28, the simulation conditions and the first to third comparative examples are the same as those shown in FIG. 16.

As shown in FIG. 28, the semiconductor light emitting device 210 of this embodiment has higher light output than those of the first to third comparative examples. The simulation reveals that the current flows sufficiently in the direction vertical to the main surface of the semiconductor light emitting layer 115.

The manufacturing method of the semiconductor light emitting device 210 will be described below with reference to FIGS. 29A to 30B. FIGS. 29A to 30B are sectional views showing the essential steps of the manufacturing process of the semiconductor light emitting device 210 in order.

The semiconductor lamination body 111 is formed on the sapphire substrate 141 by MOCVD in the same way as in FIGS. 18A to 19B. The P-side electrode 211 is formed on the P-type GaN contact layer 114 of the semiconductor lamination body 111.

Figure 29A:
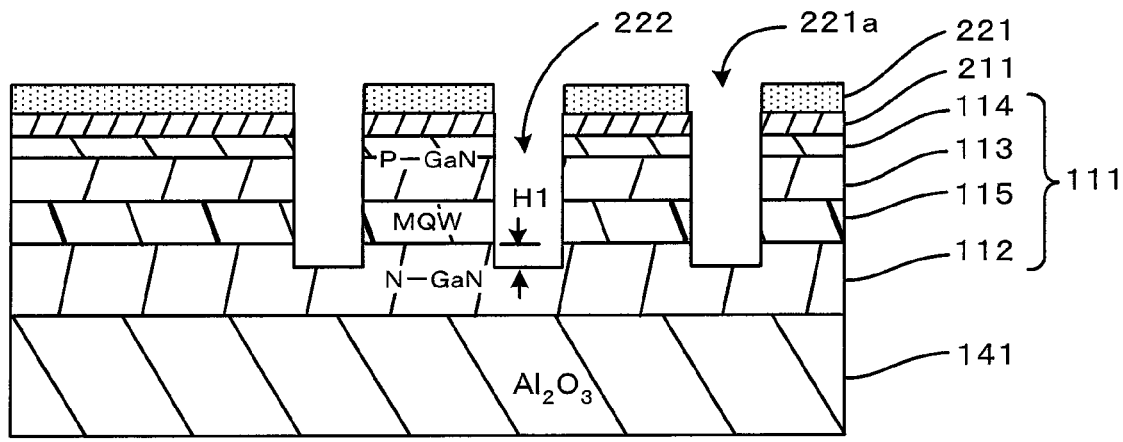
FIGS. 29A to 30B are cross-sectional views illustrating the steps of manufacturing the semiconductor light emitting device in sequential order according to the fourth embodiment.
Figure 29B:
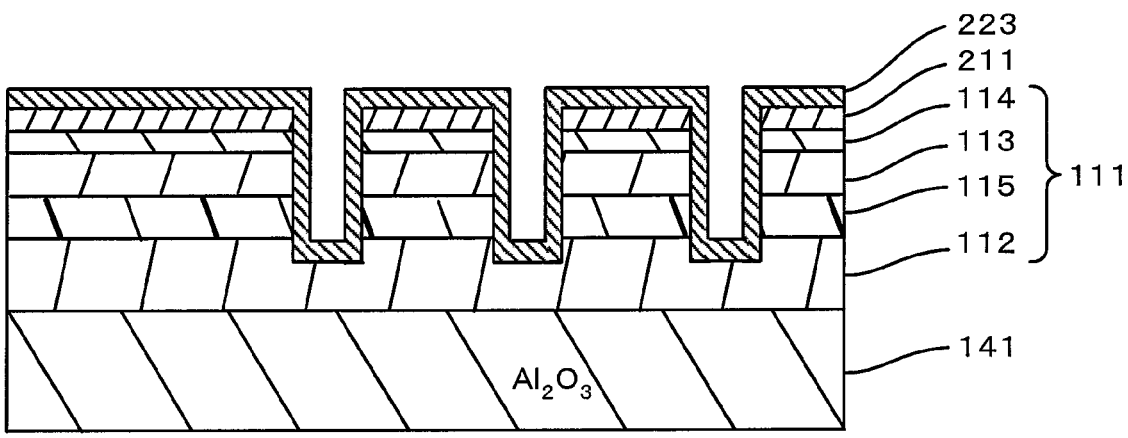

As shown in FIG. 29A, a resist film 221 with the opening 221a corresponding to the first N-side electrode 212a is formed on the P-type GaN contact layer 114 by photolithography. The P-side electrode 211 is removed by wet-etching using iodine etchant and using the resist film 221 as a mask to expose the P-type GaN contact layer 114.

The semiconductor lamination body 111 is anisotropically etched by RIE (Reactive Ion Etching) using a chlorine gas. The N-type GaN clad layer 112 is anisotropically etched just to a depth of H1 from the surface thereof. This anisotropy etching forms a via hole 222.

After the resist film 221 has been removed, a silicon oxide film 223 is formed on the resultant surface with a CVD method to conformally cover the P-type GaN contact layer 114, and the side surface and bottom of the via hole 222 with the silicon oxide film 223.

Figure 29C:
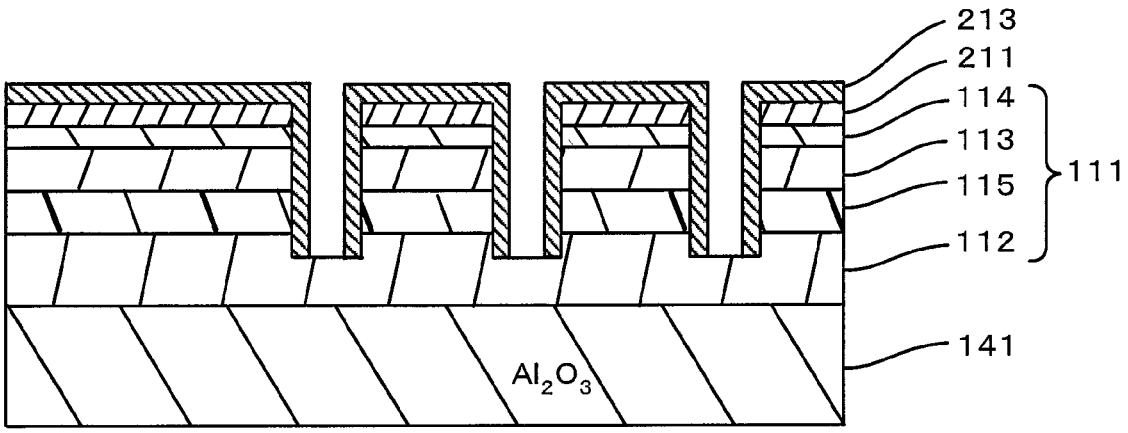

As shown in FIG. 29C, the silicon oxide film 223 is removed just from the bottom of the via hole 222. As a result, the insulating film 213 covers the top and side surfaces of the P-side electrode 211, and the side surface of the via hole 222. In addition, the silicon oxide film 223 on the bottom of the via hole 222 will be removed as follows, for example.

Positive resist is applied on the resultant surface having the silicon oxide film 223. Only the resist film on the bottom of the via hole 222 is exposed and developed to expose the silicon oxide film 223 on the bottom of the via hole 222. The exposed silicon oxide film 223 is etched by wet etching using, e.g., hydrofluoric acid solution. The resist film is removed.

Figure 30A:
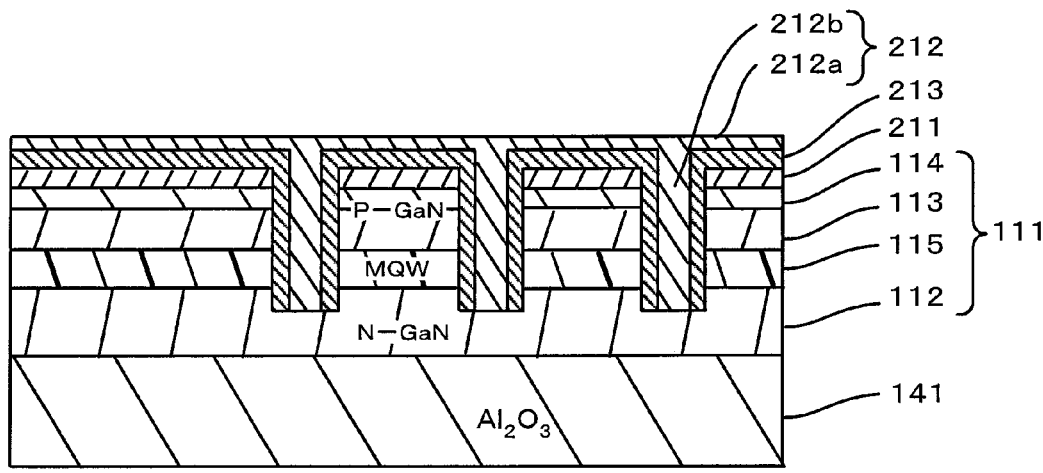

As shown in FIG. 30A, a Ti/Pt/Au laminated film is formed on the insulating film 213 by sputtering. As a result, the N-side electrode 212 includes the first N-side electrode 212a embedded in the via hole 222 via the insulating film 213 and the second N-side electrode 212b formed on the P-type GaN contact layer 114.

The sapphire substrate 141 is attached to the silicon substrate 142. Then, the sapphire substrate 141 is removed to expose the N-type GaN clad layer 112. The concave-convex portion 112a is formed on the exposed N-type GaN clad layer 112. These manufacturing steps are conducted in the same way as in FIGS. 18C to 20.

Figure 30B:
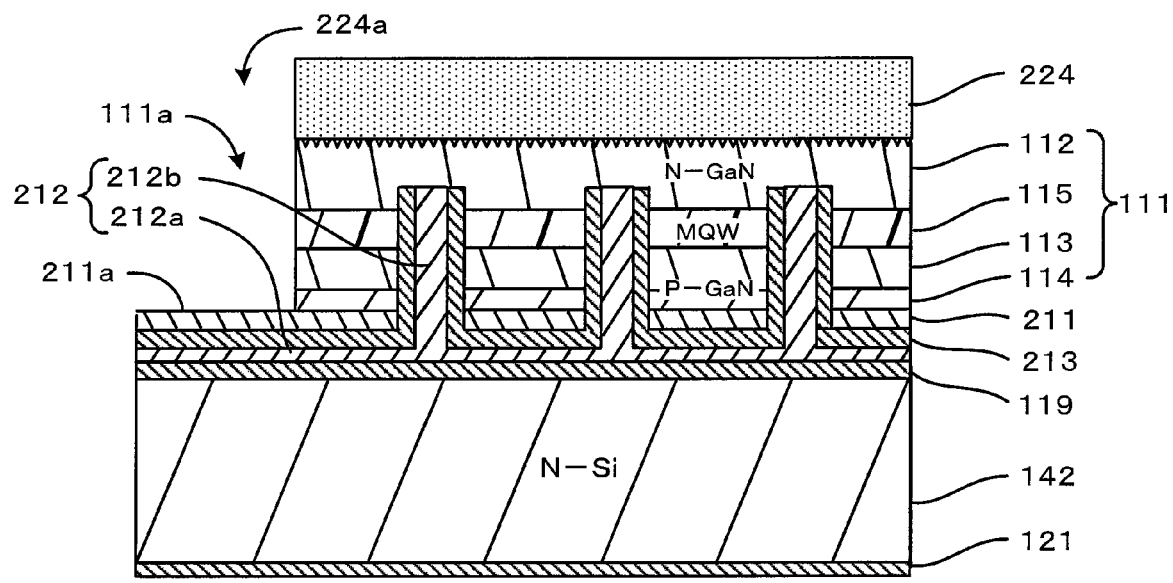

As shown in FIG. 30B, the resist film 224 is formed on the N-type GaN clad layer 112, including the opening 224a that is to be the cutout 111a. The semiconductor lamination body 111 is anisotropically etched using the resist film 224 as a mask to partially expose the P-side electrodes 211. The exposed P-side electrode 211 becomes the P-side electrode pad 211a. Then, the resist film 224 is removed. As a result, the semiconductor light emitting device 210 is achieved as shown in FIGS. 17A and 27B.

As described above, the N-side electrode 212 is formed on the side of the P-type semiconductor layer in the semiconductor light emitting device 210 of this embodiment. No electrode on the N-type GaN clad layer 112 through which light is extracted blocks the light extracted from the surface of the N-type GaN clad layer 112. Thus, the semiconductor light emitting device 210 advantageously increases its light output.

Alternatively, the P-type AlGaN overflow prevention layer 162 may be formed between the semiconductor light emitting layer 115 and the P-type GaN clad layer 113 in the same way as in the semiconductor light emitting device 160 shown in FIG. 22. Furthermore, the superlattice buffer layer 163 may be formed between the N-type GaN clad layer 112 and the semiconductor light emitting layer 115.

In the above-described case, the N-side electrode 212 has the second N-side electrode 212b. The N-side electrode 212 without the second N-side electrode 212b causes no trouble. The important point is that the first N-side electrode 212a is certainly in contact with the bonding layer 119.

Also in the above-described case, the P-side electrode is disposed to enclose the N-side electrode therewith. Alternatively, the N-side electrode may be disposed to enclose the P-side electrode.

Figure 31A:
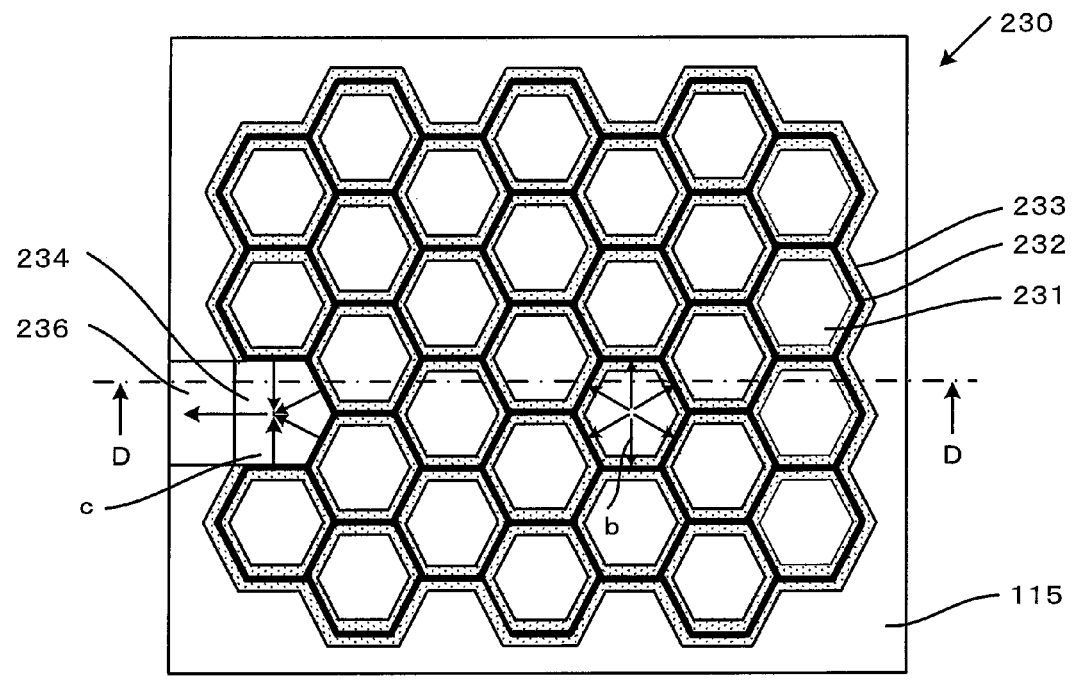
FIGS. 31A and 31B are cross-sectional views illustrating another semiconductor light emitting device according to the fourth embodiment.
Figure 31B:
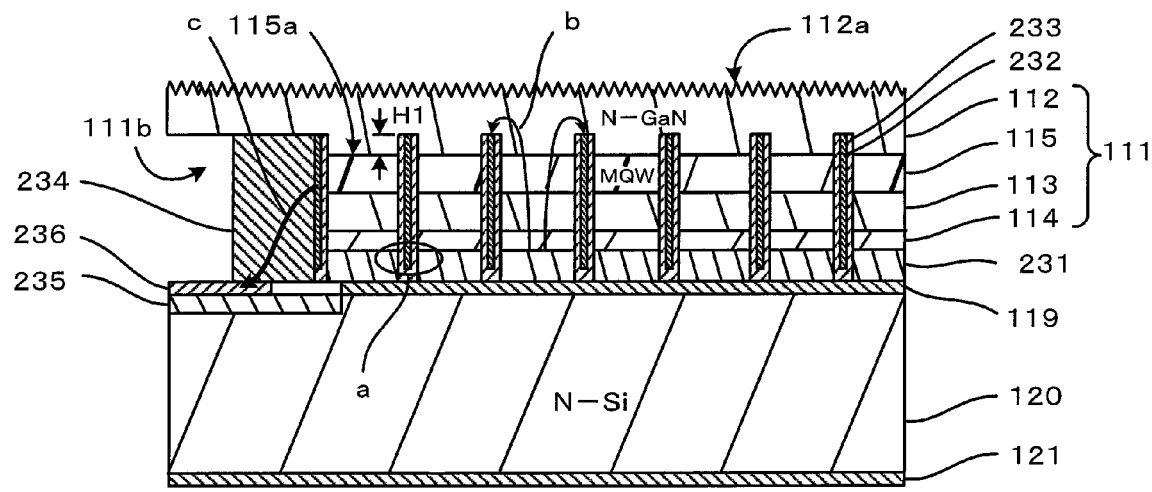

FIGS. 31A and 31B are views showing a semiconductor light emitting device where the N-side electrode is disposed to enclose the P-side electrode. FIG. 31A is a plan view with the upper portion removed. FIG. 31B is a sectional view taken along the line C-C in FIG. 31A and viewed in the arrow-direction.

As shown in FIGS. 31A and 31B, the semiconductor light emitting device 230 includes the P-side electrode 231 on the P-type GaN contact layer 114. The N-side electrode 232 includes a plurality of portions "a" such that the distance between the portions "a" and the main surface 115a is substantially equal to the distance between the main surface 115a and the P-side electrode 231. The P-side electrode 231 is disposed to enclose the N-side electrode 212 therewith at the portion "a".

That is, the N-side electrode 232 is a thin wire electrode that forms a hexagon lattice (honeycomb) horizontally as a whole and passes vertically through the semiconductor light emitting layer 115 from the P-side electrode 231 to be in contact with the N-type GaN clad layer 112. The N side electrode 232 is 2 to 20 μm in width, for example. One side of the hexagon is 6 to 60 μm in length, for example.

The N-side electrode 232 protrudes into the N-type GaN clad layer 112 just by a height of H1 from the interface between the semiconductor light emitting layer 115 and the N-type GaN clad layer 112. The insulating film 233 covers the side surface and bottom surface of the N-side electrode 232 to be electrically separated from the layers from the P-side electrode 231 to the semiconductor light emitting layer 115.

The P-side electrode 231 is divided by the honeycomb-shaped N-side electrode 232 to be enclosed with the N-side electrode 232.

Furthermore, a portion of the semiconductor light emitting layer 115 is removed from the P-type GaN contact layer 114 to form a cutout 111b in the semiconductor lamination body 111. The cutout 111b exposes the N-type GaN clad layer 112 in the semiconductor lamination body 111. A columnar N-side electrode bump 234 is formed on the N-type GaN clad layer 112 exposed to the cutout 111b. The N-side electrode bump 234 is in contact with the N-side electrode 232 adjacent thereto.

The semiconductor lamination body 111 is formed on the P-side electrode 231 so that the bonding layer 119 is sandwiched between the P-side electrode 231 and the conductive support substrate. The honeycomb-shaped P-side electrodes 231, which are in contact with the bonding layer 119, are commonly connected to the bonding layer 119.

The support substrate 120 is provided with a concave not shown adjacent to the semiconductor lamination body 111. The insulating film 235 is embedded in the concave, e.g., with a CVD method. The N-side electrode pad 236 is formed on the insulating film 235. The N-side electrode pad 235 is in contact with the N-side electrode bump 234.

Connecting the substrate electrode 121 and the N-side electrode pad 236 to the positive and negative terminals of a power supply, respectively, causes a current to flow as shown by the arrows b from the P-side electrode 231 to the N-side electrode 232 enclosing the P-side electrode 231 via the semiconductor light emitting layer 115.

The current having flowed into the N-side electrode 232 is collected and extracted from the N-side electrode 232 via the N-side electrode bump 234 and the N-side electrode pad 236. The current distribution becomes more homogeneous in the plane of the semiconductor light emitting device 230.

The manufacturing method of the semiconductor light emitting device 230 will be described below. FIGS. 32A to 33B are sectional views showing the essential steps of the manufacturing process of the semiconductor light emitting device 230.

The semiconductor lamination body 111 is formed on the sapphire substrate 141 in the same way as in FIGS. 18A and 18B. The P-side electrode 231 is formed on the P-type GaN contact layer 114 of the semiconductor lamination body 111.

Figure 32A:
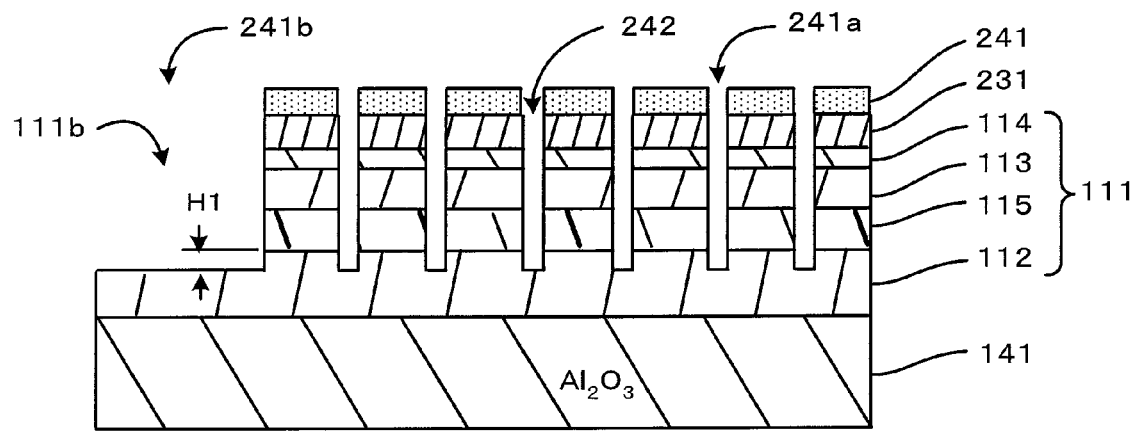
FIGS. 32A to 33B are cross-sectional views illustrating the steps of manufacturing the other semiconductor light emitting device in sequential order according to the fourth embodiment.
Figure 32B:
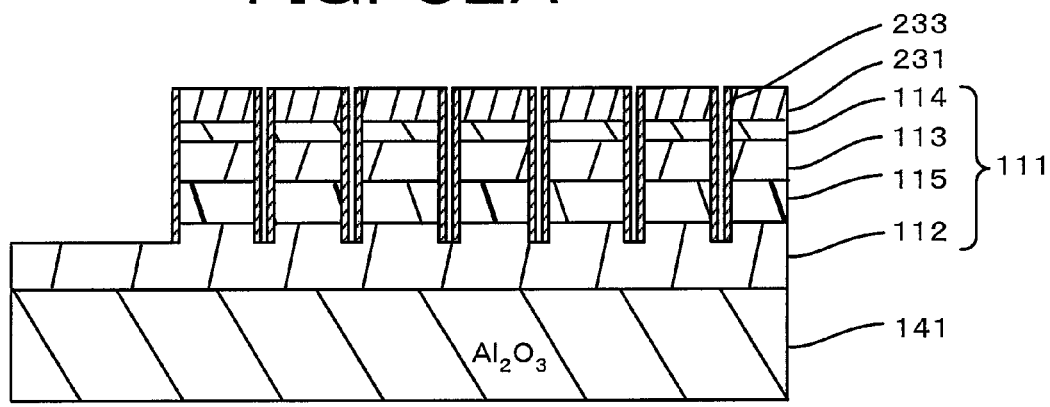

As shown in FIG. 32A, the resist film 241 is formed on the P-side electrode 231 such that the resist film 241 acquires the openings 241a and 241b both corresponding to the honeycomb-shaped N-side electrode 232 and the cutout 111b, respectively, by photolithography.

The P-side electrode 231 is removed by wet-etching using iodine etchant and using the resist film 241 as a mask to expose the P-type GaN contact layer 114. At the step, the P-side electrode 231 is divided into each hexagonal shape.

The semiconductor lamination body 111 is anisotropically etched by RIE (Reactive Ion Etching) using a chlorine gas. The N-type GaN clad layer 112 is anisotropically etched just to a depth of H1 from the surface thereof. This anisotropy etching forms a honeycomb-shaped trench and the cutout 111b.

After the resist film 241 has been removed, a silicon oxide film is formed on the resultant surface with a CVD method to conformally cover the side surface and bottom of the trench 242 with the silicon oxide film. At this time, the silicon oxide film is formed also on the side surface and bottom of the cutout 111b.

The silicon oxide film is anisotropically etched by RIE using a fluorine-containing gas. The silicon films on the P-side electrode and on the bottoms of the trench 242 and the cutout 111b are removed, and the silicon films on the side surfaces of the trench 242 and the cutout 111b are left. As a result, the insulating film 233 is formed on the side surface of the trench 242.

Figure 32C:
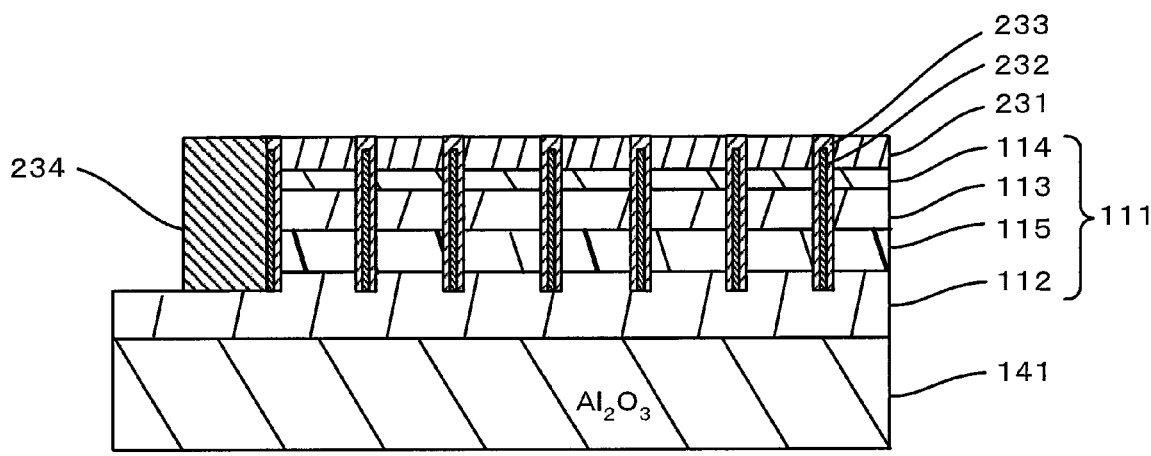

As shown in FIG. 32C, the N-side electrode 232 is embedded in the trench 242, and the end surface of the N-side electrode 232 is covered with an insulating film. This insulating film forms a portion of the insulating films 233. Simultaneously, the N-side electrode bump 234 is formed.

A concave for the cutout 111b is formed in the silicon substrate 142. A silicon oxide film is formed on the silicon substrate 142 with a CVD method, and is polished, e.g., with a CMP method until the silicon substrate 142 is exposed. This step provides the insulating film 235 embedded in the silicon substrate 142.

The bonding layer 119 is formed on the silicon substrate 142, and the N-side electrode pad 236 is formed on the insulating film 234. Preferably, the N-side electrode pad 236 is made up of the same material as the bonding layer 119.

Figure 33A:
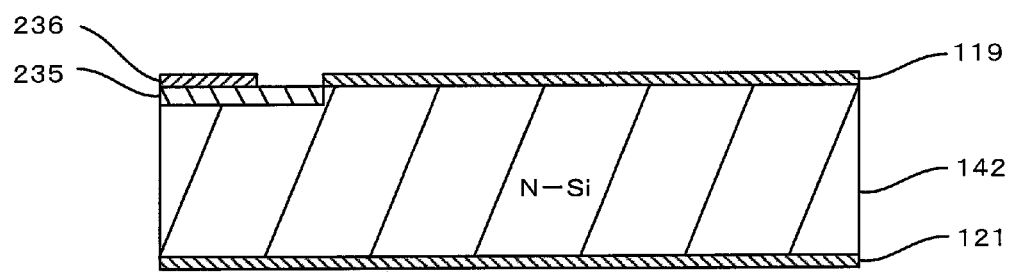
Figure 33B:
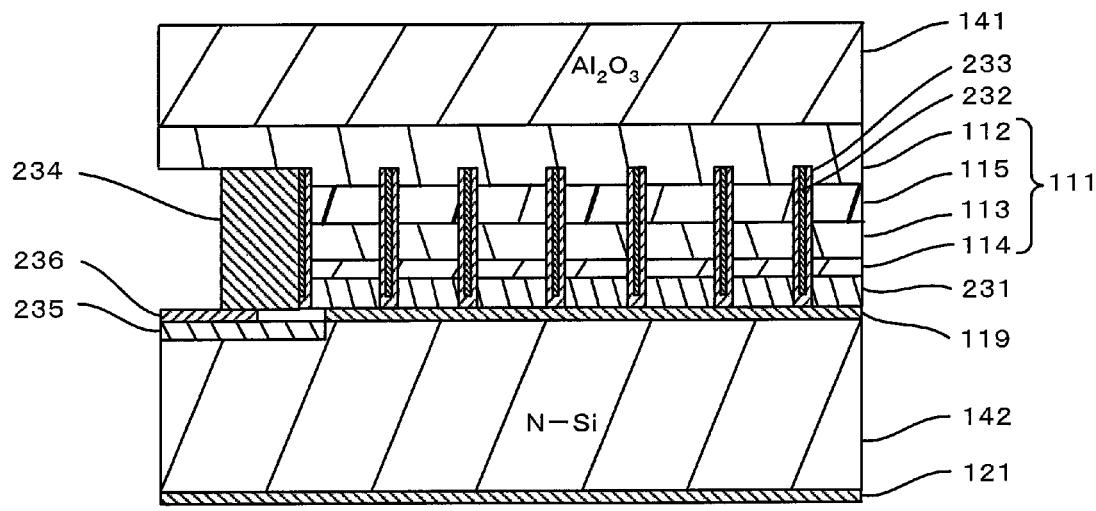

As shown in FIG. 33B, the sapphire substrate 141 is turned upside down and made to face the silicon substrate 142 such that the P-side electrode 231 is overlapped with the bonding layer 119 and the N-side electrode bump 234 is overlapped with the N-side electrode pad 236. Then, the sapphire substrate 141 and the silicon substrate 142 are pressed firmly to connect the N-side electrode 232 with the P-side electrode 231.

Figure 20:
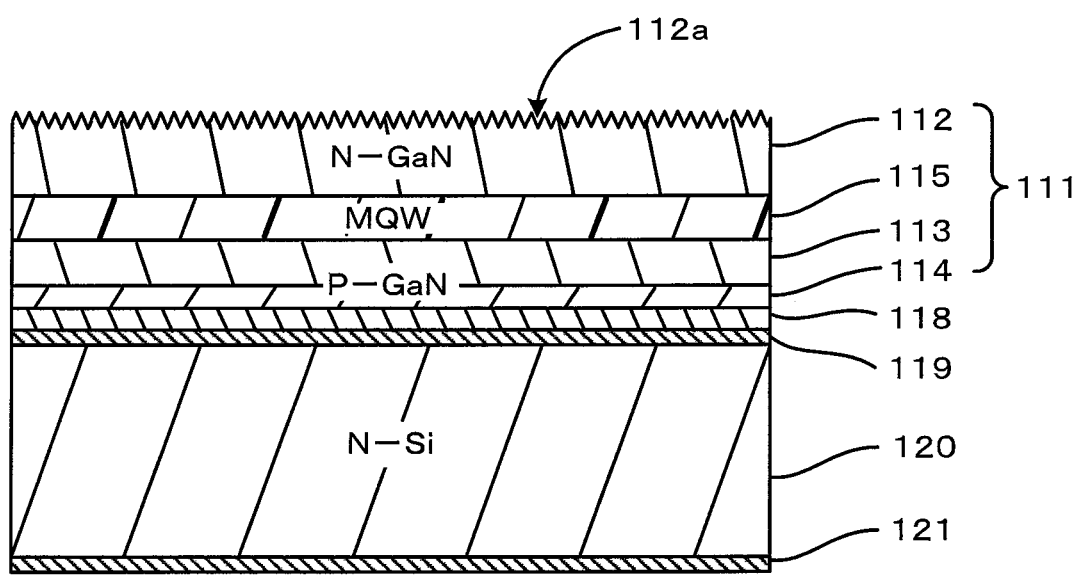

The sapphire substrate 141 and the silicon substrate 142 are in contact with each other in the same way as in FIGS. 19A to 20. Then, the sapphire substrate 141 is removed to expose the N-type GaN clad layer 112 on which the concave-convex surface 112a is to be formed. This step provides the semiconductor light emitting device 230 shown in FIGS. 31A and 31B.

As described above, the honeycomb N-side electrode 232 is disposed to enclose the P-side electrode 231.

In such a structure where the N-side electrode 232 encloses the P-side electrode 231, the distance from the center of the P-side electrode 231 to the N-side electrode 232 is constant. The structure brings about the same effect as the effect brought about by the semiconductor light emitting device 210 shown in FIGS. 27A and 27B.

Also in this structure, the N-side electrode 232 encloses the semiconductor light emitting layer 115, thereby allowing it to extract light from the N-type GaN clad layer 112. The trench 242 may be made to have a sloped side surface so that light is directed more upward.

Figure 34A:
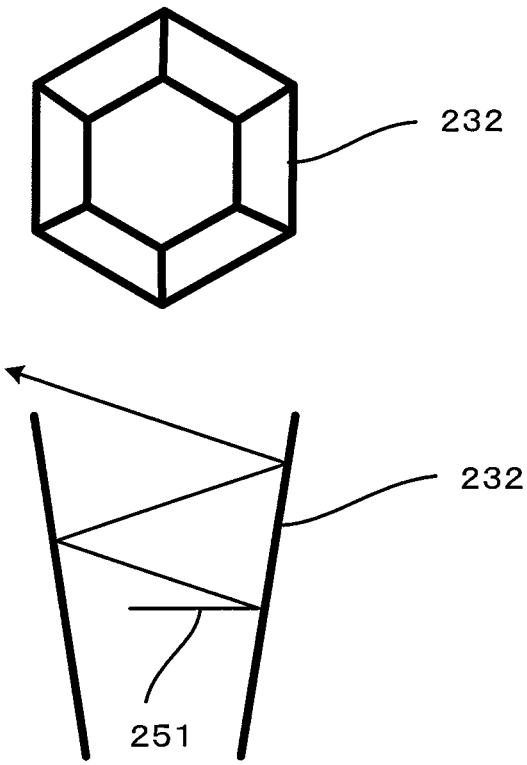
FIGS. 34A and 34B are views illustrating a main portion of another semiconductor light emitting device according to the fourth embodiment.
Figure 34B:
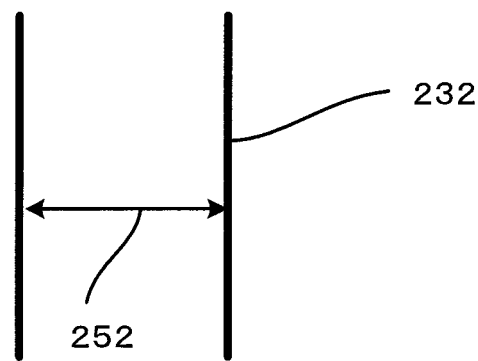

As shown in FIG. 34A, when the hexagonal N-side electrode 232 has at least one sloped side surface, light vertically incident to the sloped side surface can be directed upward. In contrast, as shown in FIG. 34B, when the hexagonal N-side electrode 232 has two parallel side surfaces, light vertically incident to the parallel side surfaces cannot be directed upward.

While certain embodiments have been described, these embodiments have been presented by way of example only, and are not intended to limit the scope of the inventions. Indeed, the novel devices described herein may be embodied in a variety of other forms; furthermore, various omissions, substitutions and changes in the form of the devices described herein may be made without departing from the spirit of the inventions. The accompanying claims and their equivalents are intended to cover such forms or modifications as would fall within the scope and spirit of the inventions.

What is claimed is:

1. A semiconductor light emitting device, comprising:
   an N-type semiconductor layer;
   a P-type semiconductor layer;
   a semiconductor light emitting layer provided between the N-type semiconductor layer and the P-type semiconductor layer, the semiconductor light emitting layer including a multiple quantum well structure, the multiple quantum well structure including well layers and barrier layers each laminated alternately such that one of the barrier layers that is between well layers and that is nearest to the P-type semiconductor layer has a narrower band gap than the other barrier layers that are between well layers, the well layers each having a band gap that is the same; and
   an N-side electrode and a P-side electrode, both being electrically connected to the N-type semiconductor layer and the P-type semiconductor layer such that current flows in a direction substantially vertical to a main surface of the semiconductor light emitting layer.

2. The device according to claim 1, wherein with the exception of the said one of the barrier layers that is between well layers a barrier layer that is nearer to the N-type semiconductor layer than another barrier layer, which is nearer to the P-type semiconductor layer, has a band gap that is equal to or wider than a band gap of said another barrier layer, which is nearer to the P-type semiconductor layer.

3. The device according to claim 1, wherein
   the P-side electrode is provided on the P-type semiconductor layer and a metal electrode to reflect light emitted from the semiconductor light emitting layer; and
   the N-side electrode is a thin wire electrode provided on the N-type semiconductor layer.

4. The device according to claim 1, further comprising:
   a transparent conductive film provided on the N-type semiconductor layer, a thin wire electrode being provided on the transparent conductive film.

* * * * *